(12) United States Patent
Shinozaki et al.

(10) Patent No.: US 7,026,687 B2
(45) Date of Patent: Apr. 11, 2006

(54) NON-VOLATILE SEMICONDUCTOR MEMORY AND METHOD OF MANUFACTURING THE SAME

(75) Inventors: Satoshi Shinozaki, Aichi (JP); Mitsuteru Iijima, Kawasaki (JP); Hideo Kurihara, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 250 days.

(21) Appl. No.: 10/387,427

(22) Filed: Mar. 14, 2003

(65) Prior Publication Data

US 2003/0197221 A1 Oct. 23, 2003

(30) Foreign Application Priority Data

Apr. 17, 2002 (JP) ........................................ 2002-114145

(51) Int. Cl.
*H01L 29/792* (2006.01)

(52) U.S. Cl. ............... 257/324; 257/314; 257/315; 257/316; 257/317; 257/318; 257/319; 257/320; 257/321; 257/322; 436/257; 436/260; 436/262; 436/263; 436/264; 436/266; 365/185

(58) Field of Classification Search ......... 257/314–324, 257/95, 117, 118, 127, 170, 244, 283, 284, 257/301–305, 330–334, 418, 419, 447, 460, 257/446, 496, 534, 571, 586, 618–628; 438/257–365; 365/185

See application file for complete search history.

(56) References Cited

U.S. PATENT DOCUMENTS 4,929,988 A * 5/1990 Yoshikawa .................. 257/316
5,012,308 A * 4/1991 Hieda ......................... 257/301
5,180,680 A * 1/1993 Yang .......................... 438/259
5,338,953 A * 8/1994 Wake .......................... 257/316
5,554,550 A * 9/1996 Yang .......................... 438/259
6,555,870 B1 * 4/2003 Kirisawa ..................... 257/324

FOREIGN PATENT DOCUMENTS

JP 53-070682 6/1978
JP 11-067937 3/1999

* cited by examiner

*Primary Examiner*—Andy Huynh
(74) *Attorney, Agent, or Firm*—Westerman Hattori Daniels & Adrian, LLP

(57) ABSTRACT

A proposed non-volatile semiconductor memory and a method of manufacturing the same are directed to performing stable and highly reliable operations. First, grooves are formed in a p-type silicon semiconductor substrate, and impurity diffusion layers are formed on the bottom surfaces of the grooves. A gate insulating film is then formed on the p-type silicon semiconductor substrate. This gate insulating film has a three-layer structure in which a first insulating film made of a silicon oxide film, a charge capturing film made of a silicon nitride film, and a second insulating film made of a silicon oxide film, are laminated in this order. A gate electrode is then formed on the gate insulating film. A convexity formed by the grooves serves as the channel region of the non-volatile semiconductor memory. Even if the device size is reduced, an effective channel length can be secured in this non-volatile semiconductor memory. Thus, excellent stability and reliability can be achieved.

5 Claims, 24 Drawing Sheets

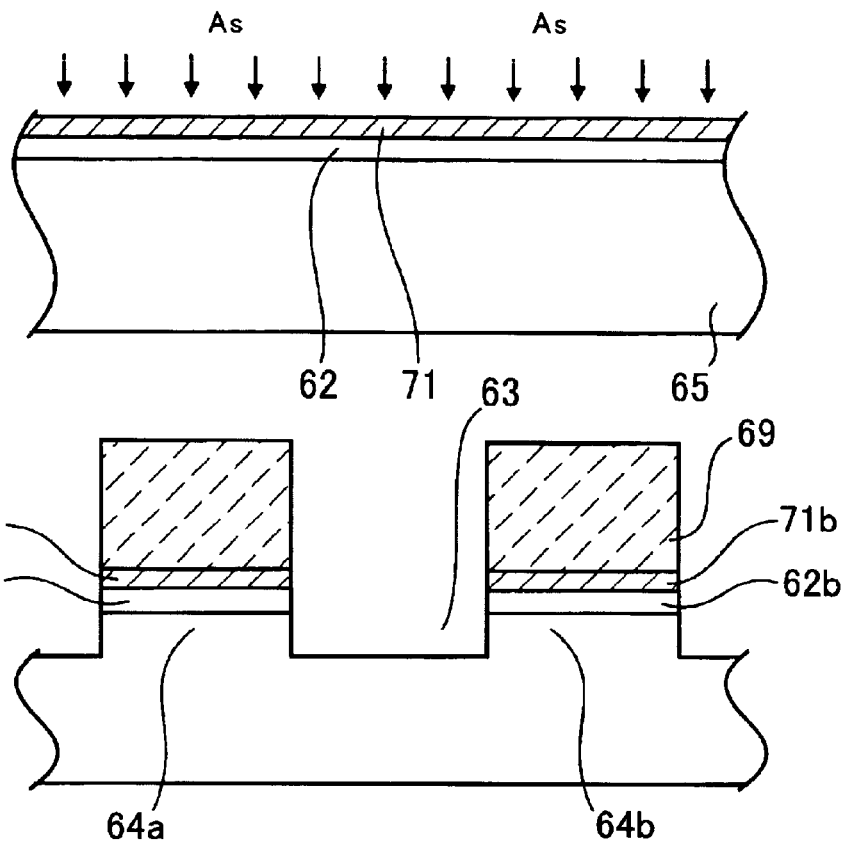
FIG.17A
FIG.17B
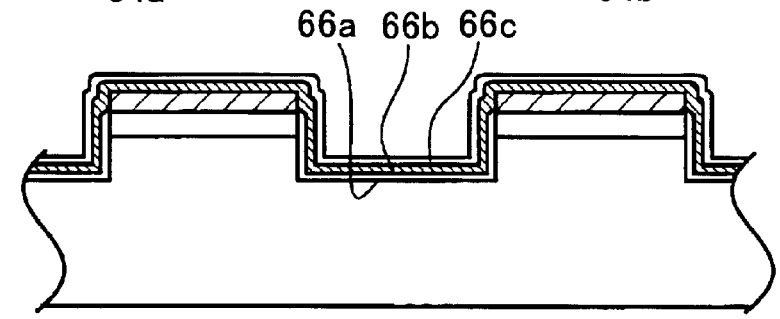
FIG.17C
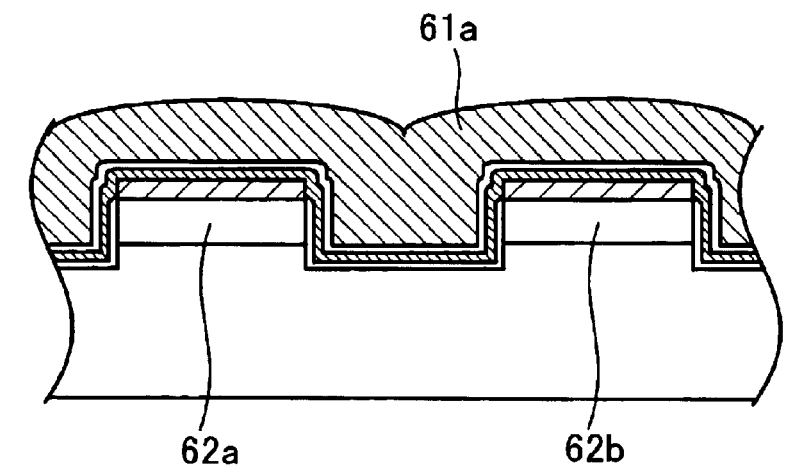
FIG.17D

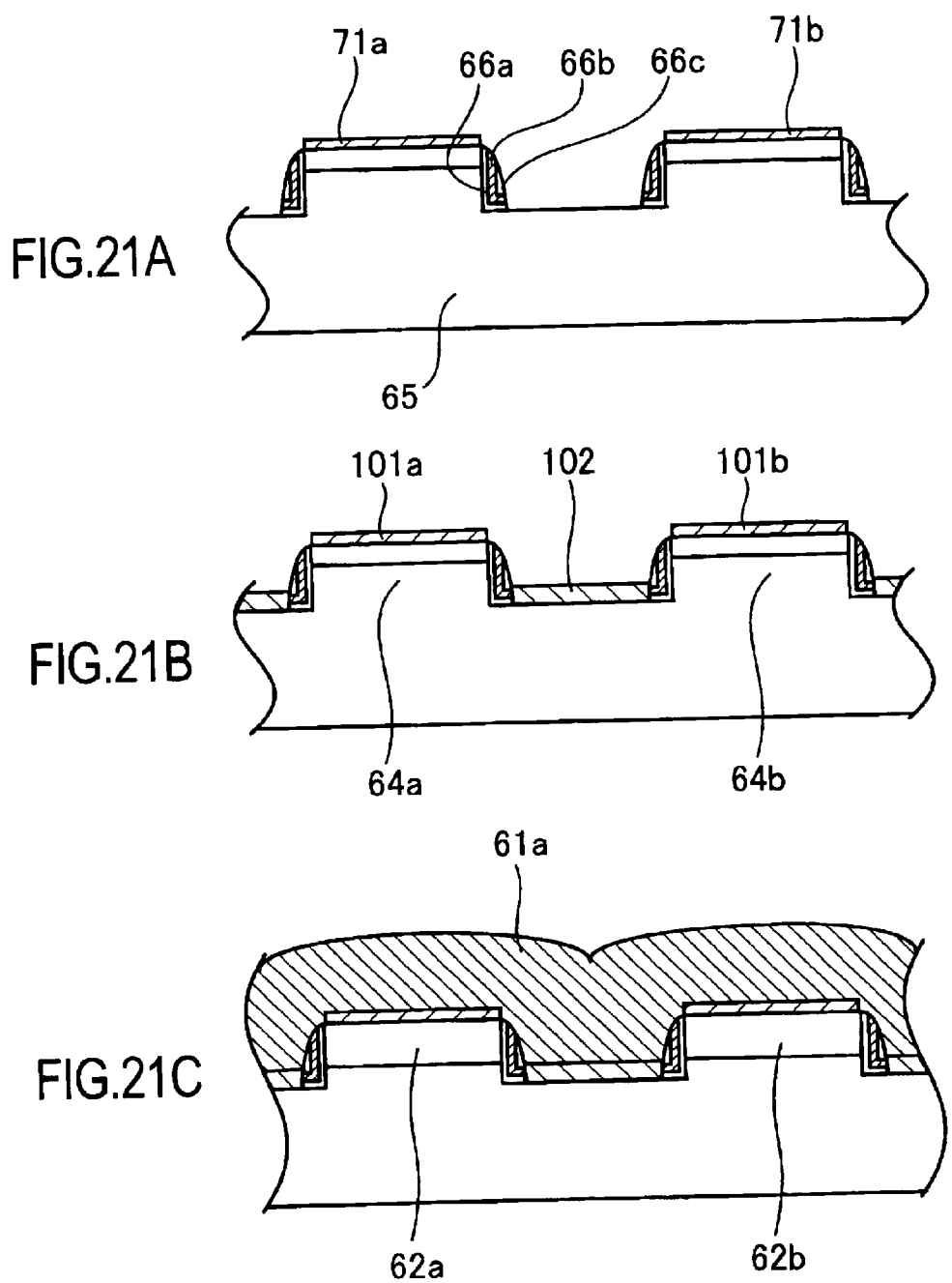

NON-VOLATILE SEMICONDUCTOR MEMORY AND METHOD OF MANUFACTURING THE SAME

CROSS-REFERENCE TO RELATED APPLICATIONS

This application is based on and claims the benefits of the priority from the prior Japanese Application No. 2002-114145, filed on Apr. 17, 2002, the entire contents of which are incorporated herein by reference.

BACKGROUND OF THE INVENTION (1) Field of the Invention

The present invention relates to non-volatile semiconductor memories and methods of manufacturing the same. More particularly, the present invention relates to a non-volatile semiconductor memory that stores information by capturing electrons in a gate insulating film formed between a semiconductor substrate and gate electrode, and a method of manufacturing such a non-volatile semiconductor memory.

(2) Description of the Related Art

There have been non-volatile semiconductor memories that perform information read and write by locally capturing electrons in an insulating film having a charge capturing ability. In recent years, non-volatile semiconductor memories that store 2-bit information in each one memory cell have been developed from the conventional non-volatile semiconductor memories.

FIGS. 23A and 23B illustrate an example of a conventional non-volatile semiconductor memory. FIG. 23A is a sectional view of the conventional non-volatile semiconductor memory in a write operation, and FIG. 23B is a sectional view of the same memory in the read operation.

A non-volatile semiconductor memory 200 has a pair of impurity diffusion layers 202 and 203 formed on the surface areas of a p-type silicon semiconductor substrate 201. The impurity diffusion layers 202 and 203 function as the source and drain of the non-volatile semiconductor memory 200. A gate insulating film 204 is formed on top of the p-type silicon semiconductor substrate 201, and a gate electrode 205 is formed on the gate insulating film 204.

The gate insulating film 204 has a three-layer structure in which a first insulating film 204a made of a silicon oxide film, a charge capturing film 204b made of a silicon nitride film, and a second insulating film 204c made of a silicon oxide film, are laminated in this order.

With this non-volatile semiconductor memory 200, information write and read are carried out by locally capturing electrons in charge capture regions formed within the charge capturing film 204b in the vicinities of the impurity diffusion layers 202 and 203 at a reasonable voltage. In FIGS. 23A and 23B, a left bit region 206 and a right bit region 207 are shown as the charge capturing regions. The non-volatile semiconductor memory 200 can write and read 1 bit each in the left bit region 206 and the right bit region 207, which is 2 bits in total.

To write information in the left bit region 206 of this non-volatile semiconductor memory 200, a voltage of 5 V is applied to the impurity diffusion layer 202, a voltage of 0 V is applied to the impurity diffusion layer 203, and a voltage of approximately 8 V is applied to the gate electrode 205. By doing so, an inversion layer 208a is formed between the impurity diffusion layers 202 and 203, as shown in FIG. 23A, and channel hot electrons generated in the vicinity of the impurity diffusion layer 202 are captured in the left bit region 206, skipping the first insulating film 204a.

To read information from the left bit region 206, the voltages reversed from the information write voltages are applied to the impurity diffusion layers 202 and 203. For example, a voltage of 0 V is applied to the impurity diffusion layer 202, and a voltage of 2 V is applied to the impurity diffusion layer 203. A voltage of approximately 5 V is applied to the gate electrode 205.

If electrons are captured in the left bit region 206, an inversion layer 208b is shut off due to the influence from the captured electrons, as shown in FIG. 23B, and the current does not flow between the impurity diffusion layers 202 and 203.

If electrons are not captured in the left bit region 206, electrons captured in the right bit region 207 do not have influence on operations of reading information from the left bit region 206. This is because, if electrons are captured in the right bit region 207, the inversion layer 208b partially disappears in the vicinity of the impurity diffusion layer 203, but the influenced range is narrower than the channel length, and the influence on the current is so small that it can be ignored. On the other hand, if electrons are not captured in the right bit region 207, the inversion layer 208b does not disappear, and a current corresponding to the applied voltages flow between the impurity diffusion layers 202 and 203.

The same applies to the case where the above electron holding conditions of the left bit region 206 and the right bit region 207 are reversed.

In recent years, there has been an increasing demand for higher performance and higher reliability in various types of smaller semiconductor devices equipped with non-volatile semiconductor memories of the above structure.

However, as the channel length becomes shorter with a reduction of the size of each semiconductor device, the ratio of the charge capturing region length to the channel length becomes higher. This fact has caused a problem that, when information is to be read from one bit region, the influence of electrons captured in the other bit region cannot be ignored.

FIGS. 24A and 24B illustrate an example of a conventional small-sized non-volatile semiconductor memory. FIG. 24A illustrates a situation in which an inversion layer has partially disappeared, and FIG. 24B illustrates a situation in which a deviation has been caused in the locations of the bit regions.

In a non-volatile semiconductor memory 300, the distance between a left bit region 302 and a right bit region 303 formed within a charge capturing film 301 is short, as the channel length is short.

In the case shown in FIGS. 24A and 24B, information is to be read from the left bit region 302 of the non-volatile semiconductor memory 300, when electrons are not captured in the left bit region 302, but are captured in the right bit region 303.

In this case, an inversion layer 304 of the channel region partially disappears in the vicinity of the right bit region 303, due to the negative electric field generated by the captured electrons, as shown in FIG. 24A. As the channel length becomes shorter, the ratio of the disappearing part of the inversion layer 304 to the channel length becomes higher. As a result, the current flowing between impurity diffusion layers 305 and 306 greatly decreases at the time of reading information from the left bit region 302, and an accurate read operation cannot be performed.

In this conventional structure, the charge capturing film 301 is formed on the entire area of the channel region. Because of this, when there is a change in the drain voltage or the gate voltage at the time of reading, the right bit region 303 that holds electrons might shift toward the left bit region 302, as shown in FIG. 24B. As a result, the effective channel length becomes shorter. This problem becomes more pronounced, when the distance between the bit regions that serves as the charge capturing regions becomes shorter with a further reduction of the channel length. This problem results in an inaccurate read operation for the same reason as the case of FIG. 24A.

To solve the above problem, the inversion layer 304 may be pinched off in front of the right bit region 303 at the time of reading information from the left bit region 302, so that the influence of the disappearance can be minimized. In doing so, however, a high voltage needs to be applied to the source and drain or the gate electrode. As a result, channel hot electrons are generated. When these electrons are captured in the charge capturing film 301, inaccurate write might be carried out at the time of reading.

Also, the above problem may be solved by narrowing the charge capturing regions through a reduction of the quantity of electrons to be captured in the charge capturing regions. In doing so, however, the reliability in data holding greatly decreases. For instance, in a case where electrons are captured in the left bit region 302 but not in the right bit region 303, a part of the inversion layer 304 in the vicinity of the left bit region 302 might not sufficiently disappear at the time of reading information from the left bit region 302, with the quantity of the captured electrons being small. This situation results in a problem that the current remains to flow.

SUMMARY OF THE INVENTION

Taking into consideration the above, it is an object of the present invention to provide a small-sized non-volatile semiconductor memory that can perform steady and reliable operations despite its size, and a method of manufacturing such a non-volatile semiconductor memory.

The above object of the present invention is achieved by a non-volatile semiconductor memory having charge capturing regions in a gate insulating film formed between a semiconductor substrate and a gate electrode. This non-volatile semiconductor memory includes the gate insulating film on the semiconductor substrate having a convexity formed thereon. In the gate insulating film, the charge capturing regions are formed in the vicinities of the side walls of the convexity.

The above object of the present invention is also achieved by a method of manufacturing a non-volatile semiconductor memory having charge capturing regions in a gate insulating film formed between a semiconductor substrate and a gate electrode. This method includes the steps of: forming grooves in the semiconductor substrate that serves as a first conductive member; forming impurity diffusion layers that serve as a second conductive member on the bottom surfaces of the grooves; and forming the gate insulating film on the semiconductor substrate having the impurity diffusion layers formed thereon. The gate insulating film includes a charge capturing film in which the charge capturing regions are to be formed.

The above object of the present invention is also achieved by a method of manufacturing a non-volatile semiconductor memory having charge capturing regions in a gate insulating film formed between a semiconductor substrate and a gate electrode. This method includes the steps of: forming an impurity diffusion layer that serves as a second conducive member on the semiconductor substrate that serves as a first conductive member; forming a groove in the semiconductor substrate having the impurity diffusion layer formed thereon; and forming the gate insulating film on the semiconductor substrate having the groove formed therein. The gate insulating film includes a charge capturing film in which the charge capturing regions are to be formed.

The above and other objects, features and advantages of the present invention will become apparent from the following description when taken in conjunction with the accompanying drawings which illustrate preferred embodiments of the present invention by way of example.

BRIEF DESCRIPTION OF THE DRAWINGS

FIG. 17A is a sectional view of a non-volatile semiconductor memory in a step of forming impurity diffusion layers and upper surface insulating films in a non-volatile semiconductor memory manufacturing method according to a seventh embodiment of the present invention.

FIG. 17B is a sectional view of the non-volatile semiconductor memory in a convexity forming step in the method according to the seventh embodiment.

FIG. 17C is a sectional view of the non-volatile semiconductor memory in a gate insulating film forming step in the method according to the seventh embodiment.

FIG. 17D is a sectional view of the non-volatile semiconductor memory in a polycide layer forming step in the method according to the seventh embodiment.

FIG. 21A is a sectional view of a non-volatile semiconductor memory in a gate insulating film removing step in a non-volatile semiconductor memory manufacturing method according to a tenth embodiment of the present invention.

FIG. 21B is a sectional view of the non-volatile semiconductor memory in a step of forming upper surface insulating films and a bottom surface insulating film in the method according to the tenth embodiment.

FIG. 21C is a sectional view of the non-volatile semiconductor memory in a polycide layer forming step in the method according to the tenth embodiment.

DESCRIPTION OF THE PREFERRED EMBODIMENTS

The following is a detailed description of embodiments of the present invention, with reference to the accompanying drawings.

First, a first embodiment of the present invention will be described.

Figure 1:
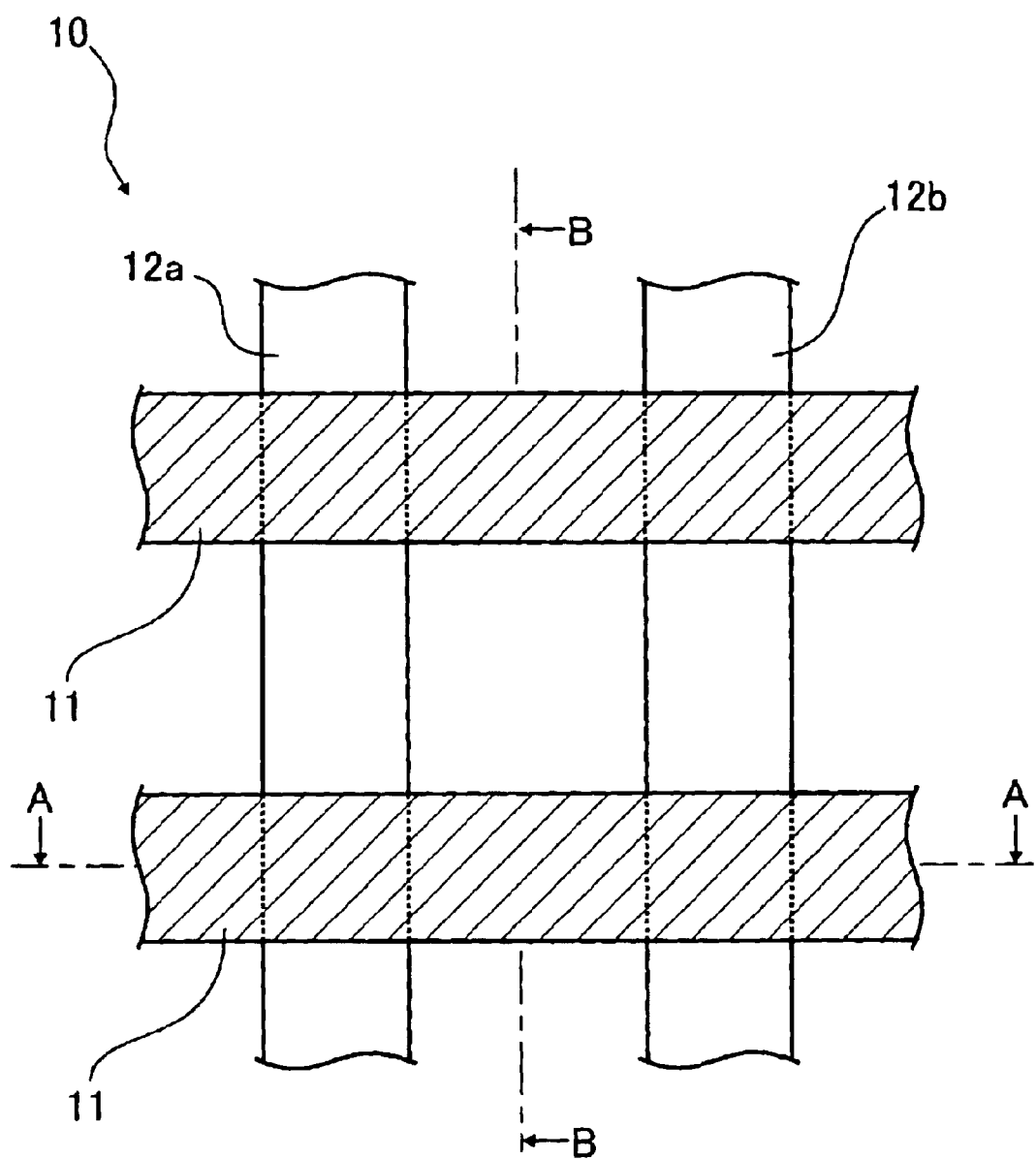
FIG. 1 is a plan view of a non-volatile semiconductor memory according to a first embodiment of the present invention.
Figure 2:
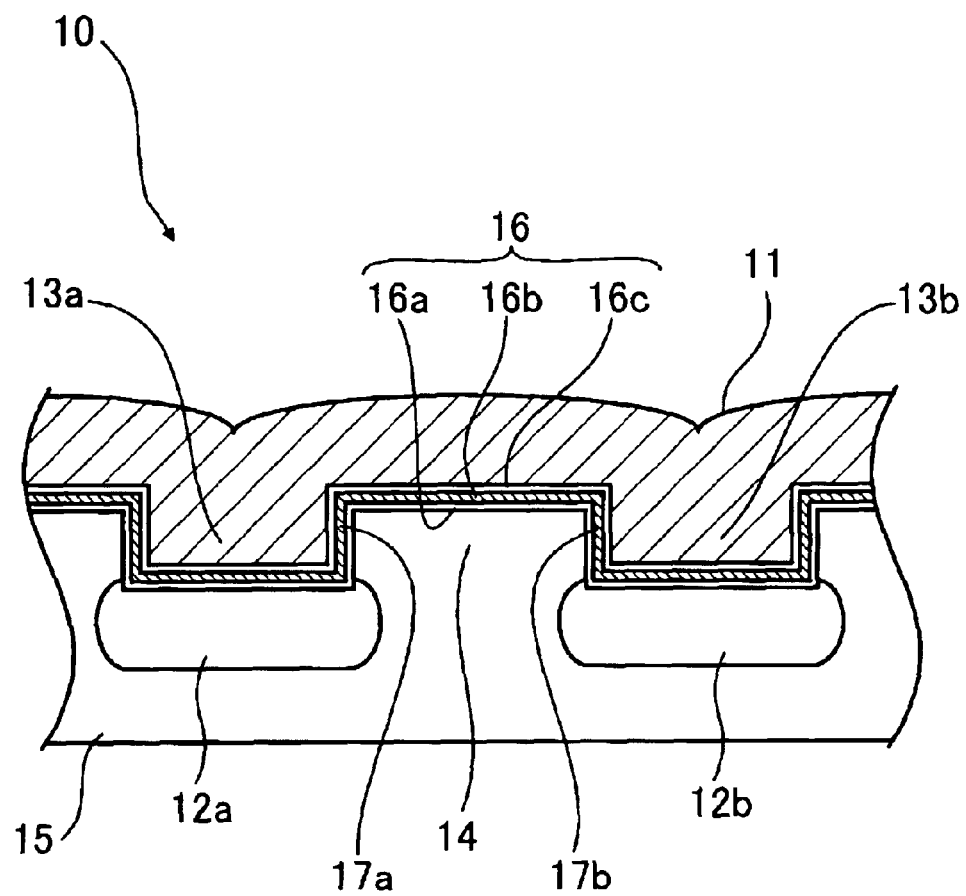
FIG. 2 is a sectional view of the non-volatile semiconductor memory, taken along the line A—A of FIG. 1.
Figure 3:
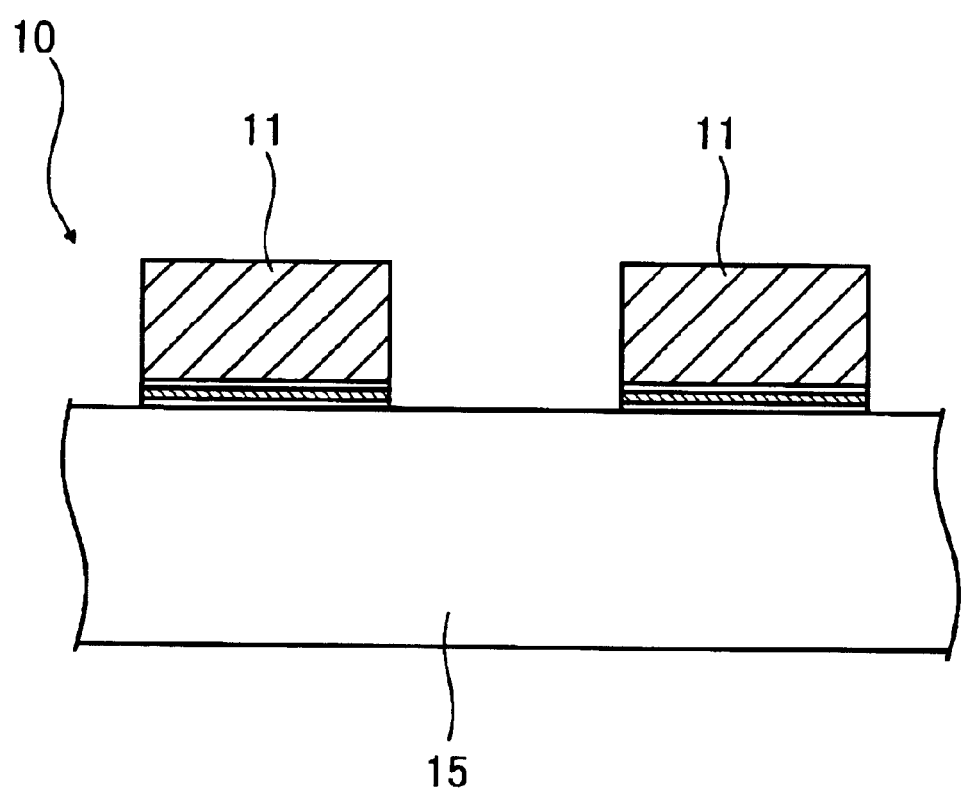
FIG. 3 is a sectional view of the non-volatile semiconductor memory, taken along the line B—B of FIG. 1.

FIG. 1 is a plan view of a non-volatile semiconductor memory in accordance with the first embodiment of the present invention. FIG. 2 is a sectional view of the non-volatile semiconductor memory, taken along the line A—A of FIG. 1. FIG. 3 is a sectional view of the non-volatile semiconductor memory, taken along the line B—B of FIG. 1.

As shown in FIG. 1, a non-volatile semiconductor memory 10 has gate electrodes 11 and impurity diffusion layers 12a and 12b. The impurity diffusion layers 12a and 12b function as the source and drain, and cross the gate electrodes 11 at right angles.

As shown in FIG. 2, the non-volatile semiconductor memory 10 includes a p-type silicon semiconductor substrate 15 that has a convexity 14 interposed between two grooves 13a and 13b. The impurity diffusion layers 12a and 12b are formed on the bottom surfaces of the grooves 13a and 13b, respectively. A gate insulating film 16 is formed on the p-type silicon semiconductor substrate 15. This gate insulating film 16 has a three-layer structure in which a first insulating film 16a made of a silicon oxide film, a charge capturing film 16b made of a silicon nitride film, and a second insulating film 16c made of a silicon oxide film, are laminated in this order. The gate electrodes 11 are formed on the gate insulating film 16. In this non-volatile semiconductor memory 10, the convexity 14 of the p-type silicon semiconductor substrate 15 serves as the channel region.

In the non-volatile semiconductor memory 10 shown in the sectional view of FIG. 2 taken along the line A—A of FIG. 1, the gate electrodes 11 are formed on the gate insulating film 16 made up of memory cells that are arranged continually in the transverse direction of FIG. 1. In the sectional view of FIG. 3 taken along the line B—B of FIG. 1, the gate electrodes 11 made up of memory cells arranged in the longitudinal direction of FIG. 1 are electrically independent of each other.

In this non-volatile semiconductor memory 10, the charge capturing regions (the bit regions) at the time of writing information are formed at the side wall parts (including the side walls and their vicinities) of the convexity 14 in the charge capturing film 16b through a predetermined voltage application. The non-volatile semiconductor memory 10 has two bit regions: a left bit region 17a on the side of the impurity diffusion layer 12a and a right bit region 17b on the side of the impurity diffusion layer 12b, as shown in FIG. 2. In the non-volatile semiconductor memory 10, read and write of 2-bit information are performed. More specifically, 1-bit information read and write are performed in each of the left bit region 17a and the right bit region 17b.

Figure 4:
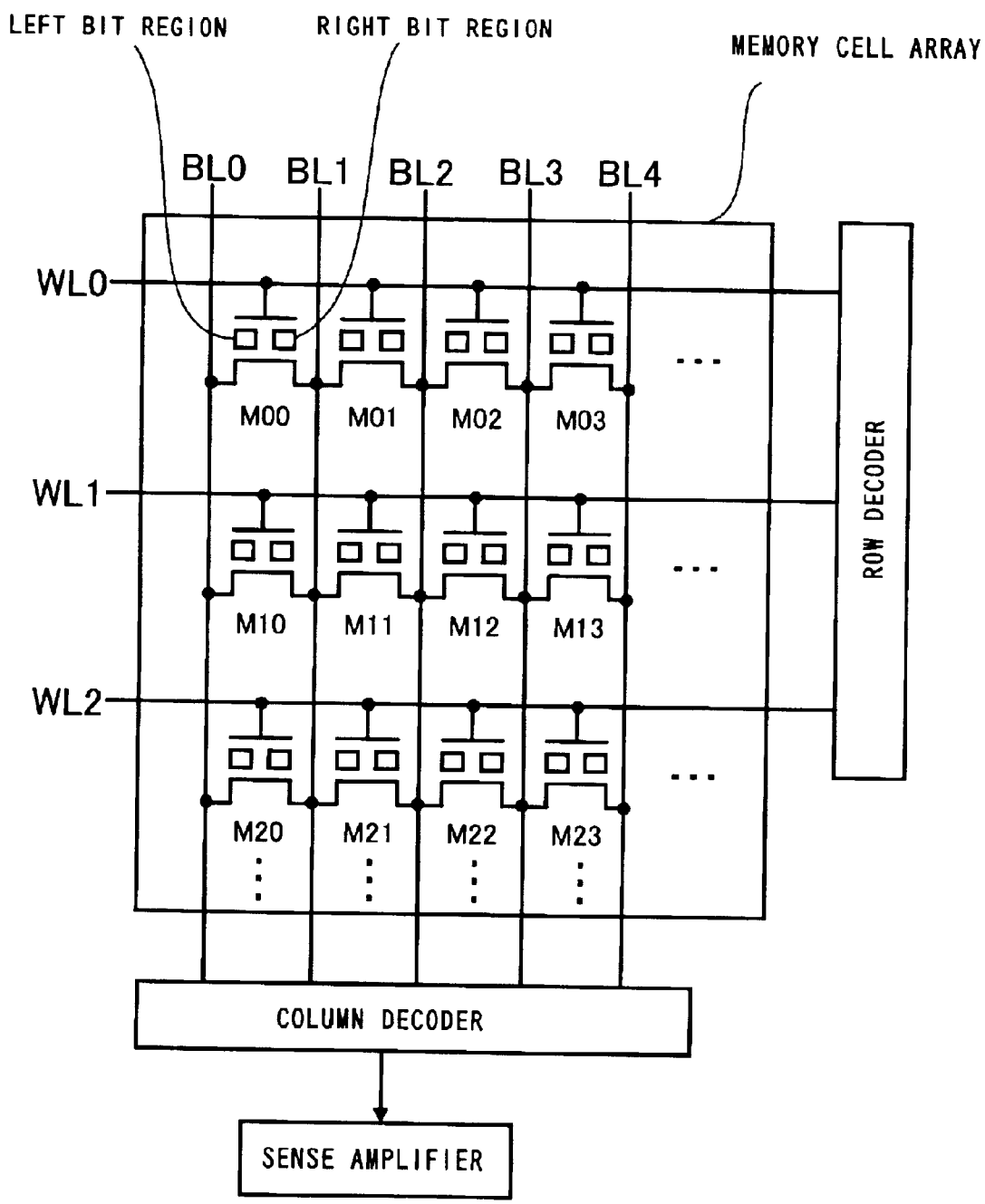
FIG. 4 illustrates an example of the circuit structure of the non-volatile semiconductor memory according to the first embodiment.

FIG. 4 illustrates an example of the circuit structure of the non-volatile semiconductor memory.

The circuit of the non-volatile semiconductor memory includes a memory cell array, a row decoder, a column decoder, a sense amplifier, a reference current generator circuit (not shown), an input-output circuit (not shown), and a control circuit (not shown).

The memory cell array consists of a plurality of memory cells M00, M01, . . . Mnn. Each of the memory cells M00, M01, . . . Mnn has two bit regions: a left bit region and a right bit region.

The gate electrode and the source and drain of each of the memory cells M00, M01, . . . . are connected to word lines WL0, WL1 . . . , and bit lines BL0, BL1 . . . , respectively. For instance, the gate electrode of the memory cell M00 is connected to the work line WL01, and the source and drain of the memory cell M00 are connected to the bit lines BL0 and BL1.

The information read and write operations to be performed in the non-volatile semiconductor memory 10 shown in FIGS. 1 through 3 are carried out by applying a predetermined voltage to the gate electrodes 11 and the impurity diffusion layers 12a and 12b, which function as the source and drain, through the word lines and the bit lines.

Figure 5A:
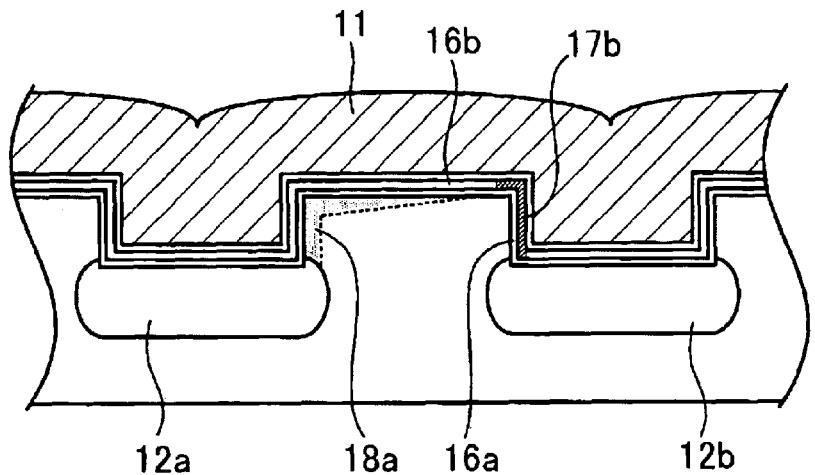
FIG. 5A illustrates a write operation of the non-volatile semiconductor memory according to the first embodiment.
Figure 5B:
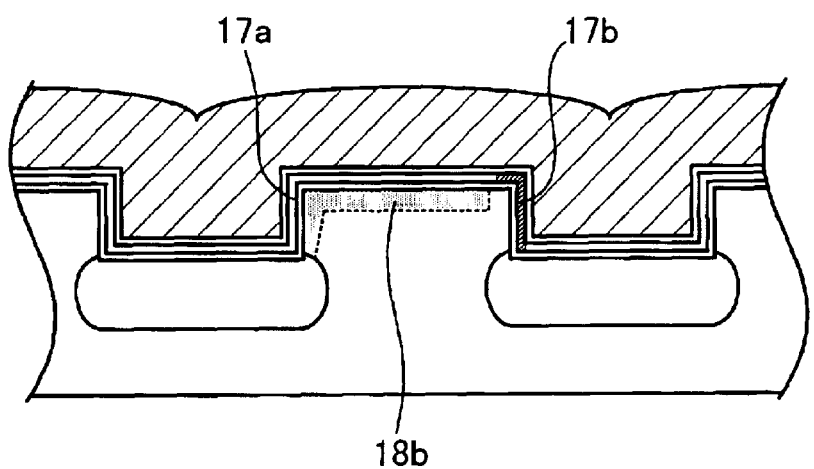
FIG. 5B illustrates a read operation of the non-volatile semiconductor memory according to the first embodiment.
Figure 5C:
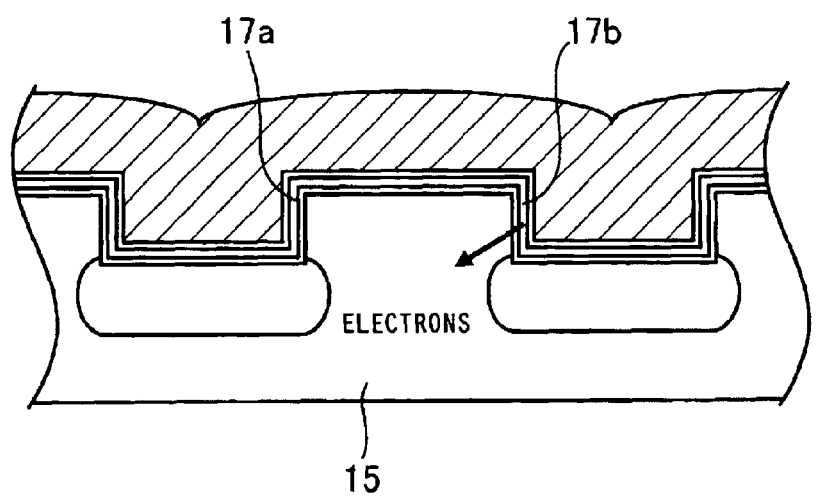
FIG. 5C illustrates an erase operation of the non-volatile semiconductor memory according to the first embodiment.

FIGS. 5A through 5C illustrate an operation of the non-volatile semiconductor memory in accordance with the first embodiment of the present invention. FIG. 5A illustrates a write operation, FIG. 5B illustrates a read operation, and FIG. 5C illustrates an erase operation. In FIGS. 5A and 5B, electrons are captured in the right bit region 17b.

First, a case of writing information in the right bit region 17b will be described. In this case, the voltage to be applied to the impurity diffusion layer 12a as the source is set at 0 V, and the voltage to be applied to the impurity diffusion layer 12b as the drain is set at approximately 5 V, so that a potential difference is caused between the source and drain. A high voltage of approximately 10 V is then applied to the gate electrodes 11. By doing so, an inversion layer 18a is formed between the impurity diffusion layers 12a and 12b, as shown in FIG. 5A. The channel hot electrons generated in the vicinity of the impurity diffusion layer 12b are then captured in the right bit region 17b, skipping the first insulating film 16a.

In a case of reading information from the right bit region 17b, the voltages reversed from the voltages in the case of writing are applied to the source and drain. More specifically, a voltage of 2 V is applied to the impurity diffusion layer 12a as the drain, and a voltage of 0 V is applied to the impurity diffusion layer 12b as the source, for example. By doing so, an inversion layer 18b is formed between the impurity diffusion layers 12a and 12b.

If electrons are captured in the right bit region 17b at this point, the inversion layer 18b is not formed in the vicinity of the right bit region 17b due to the negative electric field generated by the captured electrons, as shown in FIG. 5B. As a result, the current does not flow between the source and drain. On the other hand, if electrons are not captured in the right bit region 17b, the inversion layer 18b is formed also in the vicinity of the right bit region 17b, and the current flows between the source and drain, although such a case is not shown in the drawings. In this manner, the non-volatile semiconductor memory 10 can store 1-bit information, depending on whether electrons are captured in the charge capturing regions.

Information read and write can be performed on the left bit region 17a in the same manner as in the case of the right bit region 17b. In doing so, the voltages reversed from the voltages applied in the information read and write operations performed on the right bit region 17b are applied.

In a case of erasing information that has been written in the charge capturing regions, a negative high voltage of approximately −10 V is applied to the gate electrodes 11, and a positive high voltage of approximately 10 V is applied to the p-type silicon semiconductor substrate 15. By doing so, the electrons captured in the right bit region 17b are removed from the right bit region 17b and introduced into the p-type silicon semiconductor substrate 15 by FN tunneling, as shown in FIG. 5C. Here, the voltages applied to the source and drain are open voltages or 0 V. In a case of erasing information from the left bit region 17a, the same process as the above should be carried out.

In another method of erasing information, a negative high voltage of approximately −10 V is applied to the gate electrodes 11, and a positive voltage of approximately 5 V is applied to the impurity diffusion layer 12b. In this method, a depletion layer is formed in the vicinity of the impurity diffusion layer 12b as a result of the voltage application, and the hot holes generated here are introduced into the right bit region 17b to neutralize the charge capturing regions. Here, the voltage applied to the impurity diffusion layer 12a is an open voltage or 0 V.

When information written in the left bit region 17a is to be erased in the same manner as the above, a negative high voltage of approximately −10 V is applied to the gate electrodes 11, and a positive voltage of approximately 5 V is applied to the impurity diffusion layer 12a. The generated hot holes are then introduced into the left bit region 17a to neutralize the charge capturing regions.

When information written in the left bit region 17a and information written in the right bit region 17b are to be erased at the same time, a negative high voltage should be applied to the gate electrode 11, and a positive voltage should be applied to both of the impurity diffusion layers 12a and 12b.

As described above, a convex channel region is formed on the p-type silicon semiconductor substrate 15 in the non-volatile semiconductor memory 10 having the gate electrode 11 via the gate insulating film 16. The charge capturing regions are then formed within the gate insulating film 16 in the side walls of the convexity 14 of the p-type silicon semiconductor substrate 15. Accordingly, an effective channel length can be maintained, even though the device size has become smaller. Thus, a reduction in device size can be readily achieved, and non-volatile semiconductor memories with high reliability can be obtained.

Next, a method of manufacturing the non-volatile semiconductor memory 10 having the above structure will be described.

Figure 6A:
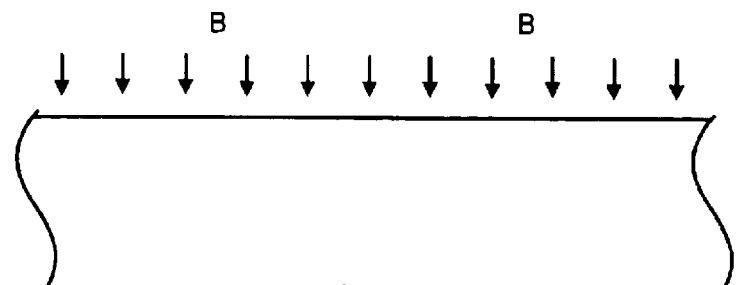
FIG. 6A is a sectional view of the non-volatile semiconductor memory in a first ion implanting step of a non-volatile semiconductor memory manufacturing method according to the first embodiment.
Figure 6B:
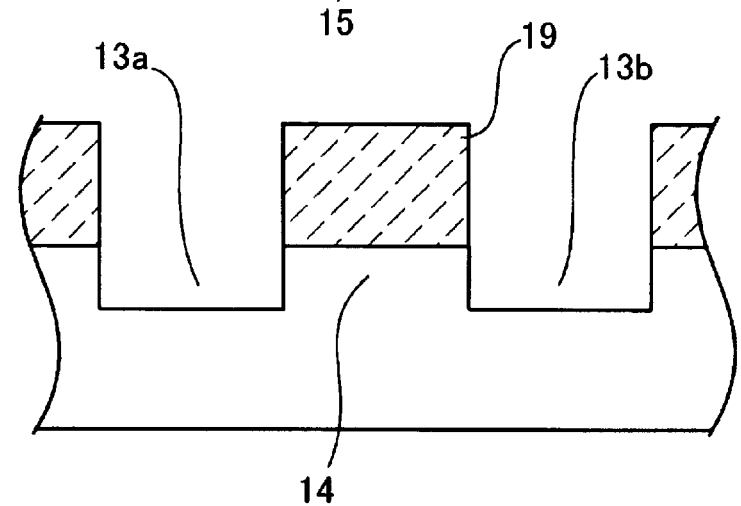
FIG. 6B is a sectional view of the non-volatile semiconductor memory in a convexity forming step in the method according to the first embodiment.
Figure 6C:
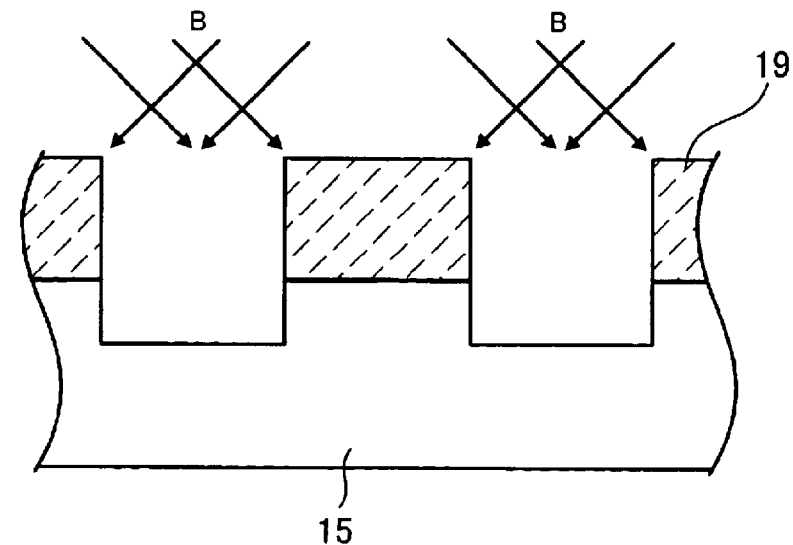
FIG. 6C is a sectional view of the non-volatile semiconductor memory in a second ion implanting step in the method according to the first embodiment.
Figure 7A:
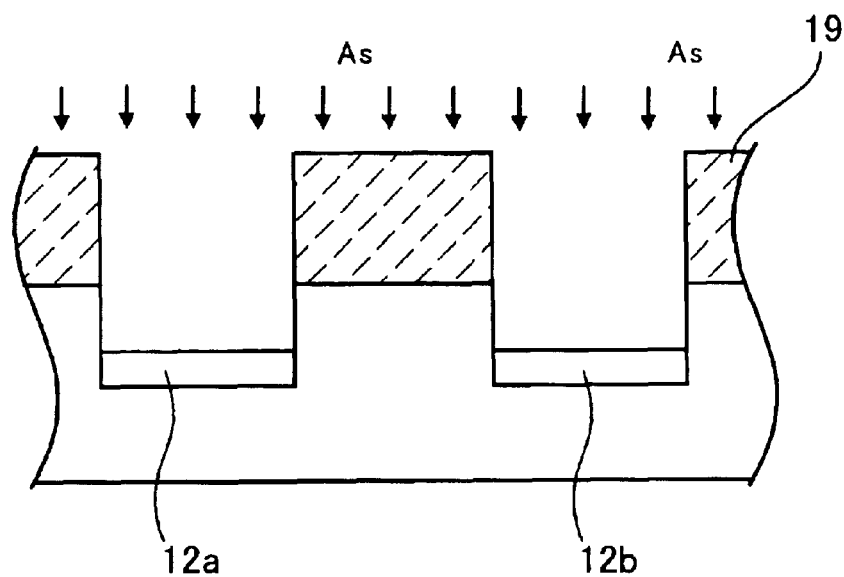
FIG. 7A is a sectional view of the non-volatile semiconductor memory in an impurity diffusion layer forming step in the method according to the first embodiment.
Figure 7B:
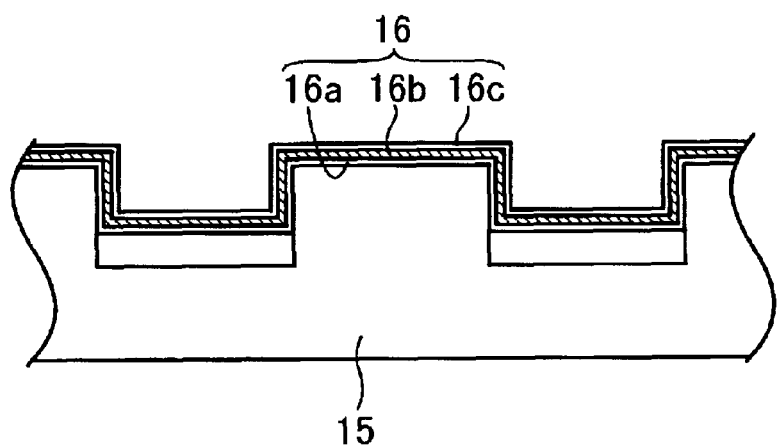
FIG. 7B is a sectional view of the non-volatile semiconductor memory in a gate insulating film forming step in the method according to the first embodiment.
Figure 7C:
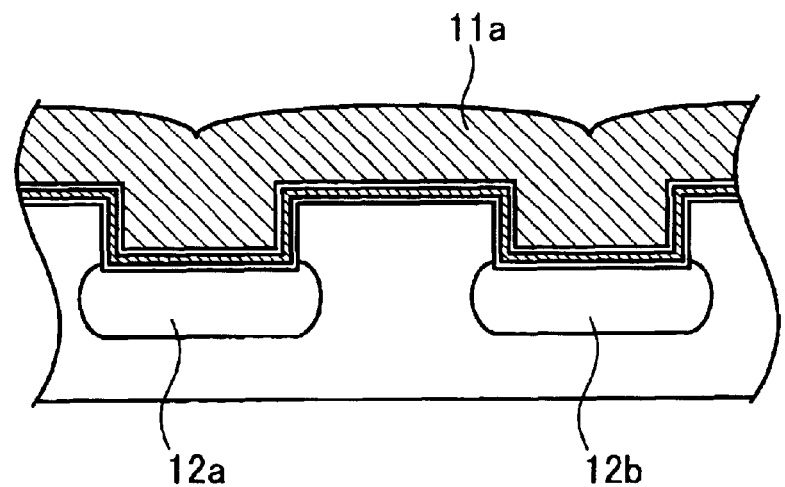
FIG. 7C is a sectional view of the non-volatile semiconductor memory in a polycide layer forming step in the method according to the first embodiment.

FIGS. 6A through 7C illustrate the method of manufacturing the non-volatile semiconductor memory in accordance with the first embodiment of the present invention. More specifically, FIG. 6A is a sectional view of the non-volatile semiconductor memory in a first ion implanting step. FIG. 6B is a sectional view of the non-volatile semiconductor memory in a convexity forming step. FIG. 6C is a sectional view of the non-volatile semiconductor memory in a second ion implanting step. FIG. 7A is a sectional view of the non-volatile semiconductor memory in an impurity diffusion layer forming step. FIG. 7B is a sectional view of the non-volatile semiconductor memory in a gate insulating film forming step. FIG. 7C is a sectional view of the non-volatile semiconductor memory in a polycide layer forming step.

First, a predetermined well is formed on the p-type silicon semiconductor substrate 15, and device separation is carried out in the peripheral circuit region (not shown).

Next, boron (B) ions that are p-type impurities are implanted onto the entire surface of the p-type silicon semiconductor substrate 15 by a known ion implantation technique, as shown in FIG. 6A. This ion implantation is carried out with an acceleration energy of 30 KeV to 90 KeV, and the dose of ions is approximately $5 \times 10^{11}$ ions/cm$^2$ to $5 \times 10^{12}$ ions/cm$^2$.

Next, a photoresist 19 is formed on the p-type silicon semiconductor substrate 15 by a known photolithography technique, as shown in FIG. 6B. The p-type silicon semiconductor substrate 15 is then selectively removed by an etching technique, with the photoresist 19 being the mask, so as to form the grooves 13a and 13b. As a result, the convexity 14 appears in the p-type silicon semiconductor substrate 15.

The grooves 13a and 13b each has a width of approximately 0.3 µm and a depth of approximately 0.15 µm. However, this width and depth are merely an example, and may be arbitrarily changed with the applied voltage range and the required data holding ability of the non-volatile semiconductor memory to be formed.

With the photoresist 19 being the mask, boron ions are implanted onto the p-type silicon semiconductor substrate 15 in an inclined state by a known ion implantation technique, as shown in FIG. 6C. This ion implantation is carried out with an acceleration energy of approximately 30 keV to 90 keV, and the dose of boron ions is approximately $5 \times 10^{11}$ ions/cm$^2$ to $5 \times 10^{12}$ ions/cm$^2$.

With the photoresist 19 being the mask, arsenic (As) ions that are n-type impurities are implanted with an acceleration energy of approximately 50 keV, as shown in FIG. 7A. Here, the dose of arsenic ions is approximately $1 \times 10^{15}$ ions/cm$^2$ to $5 \times 10^{15}$ ions/cm$^2$. In this manner, the impurity diffusion layers 12a and 12b that function as the source and drain and the bit lines for the memory cells are formed.

The photoresist 19 is then removed, and a silicon oxide film of approximately 10 nm in thickness is formed on the exposed p-type silicon semiconductor substrate 15 by a known thermal oxidation technique, as shown in FIG. 7B. In this manner, the first insulating film 16a is formed.

On the first insulating film 16a, a silicon nitride film of approximately 10 nm in thickness is formed by a known CVD (Chemical Vapor Deposition) technique, so as to form the charge capturing film 16b.

After that, the upper part of the charge capturing film 16b is subjected to a thermal treatment by a known thermal oxidation technique, in an atmosphere of oxygen at 900 to 950° C. for 30 to 60 minutes. As a result, the upper 10 nm of the charge capturing film 16b is oxidized and forms the second insulating film 16c.

In this manner, the gate insulating film 16 having a three-layer structure that consists of the first insulating film 16a, the charge capturing film 16b, and the second insulating film 16c, is formed.

The polycide layer 11a is next formed on the entire surface by a known CVD technique, as shown in FIG. 7C. The formation of this polycide layer 11a is carried out by forming a polycrystalline silicon film of approximately 300 nm in thickness that contains approximately $2 \times 10^{20}$ atoms/cm$^3$ to $6 \times 10^{20}$ atoms/cm$^3$ of phosphorous (P), and a tungsten silicide film of approximately 200 nm in thickness.

The polycide layer 11a is then processed by a known photolithography technique and etching technique, so as to form the gate electrodes 11 shown in FIGS. 1 through 3. After that, an impurity activating thermal treatment is carried out by a known thermal diffusion technique, so as perform diffusion and activation on the impurity diffusion layers 12a and 12b.

At last, contact holes (not shown) are opened, and metal wirings are arranged.

In the above explanation, the ion implantations of boron ions shown in FIGS. 6A and 6C are carried out to adjust the impurity concentration in the convexity 14 that serves as the channel region. Therefore, these steps may be carried out when necessary, and the order of the steps is not limited to the above. For instance, the ion implanting step shown in FIG. 6A may be carried out after the formation of the gate insulating film 16 shown in FIG. 7B.

In the following, second to fifth embodiments of the present invention will be described as modifications of the first embodiment, with reference to the accompanying drawings.

First, the second embodiment will be described.

Figure 8A:
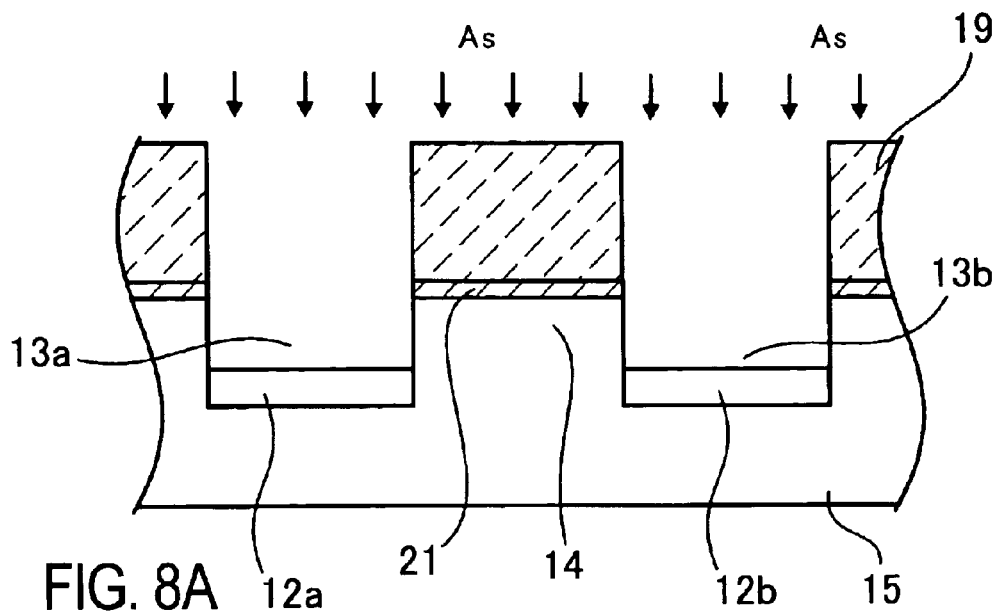
FIG. 8A is a sectional view of a non-volatile semiconductor memory in an impurity diffusion layer forming step in a non-volatile semiconductor memory manufacturing method according to a second embodiment of the present invention.
Figure 8B:
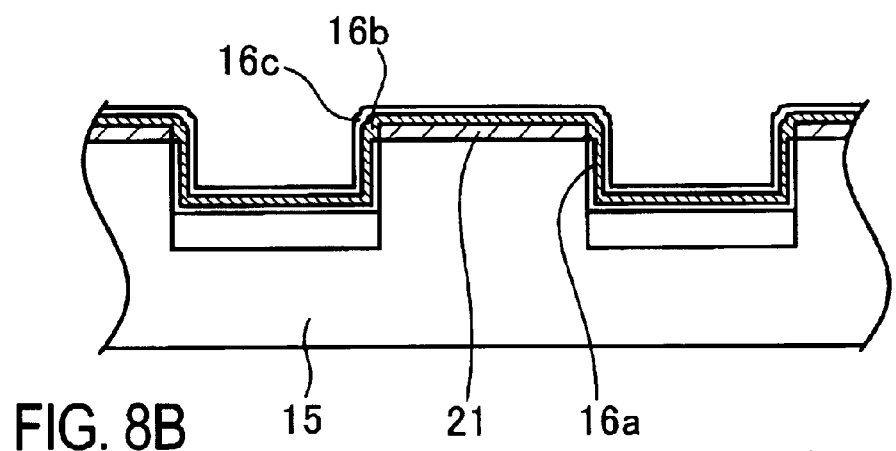
FIG. 8B is a sectional view of the non-volatile semiconductor memory in a gate insulating film forming step in the method according to the second embodiment.
Figure 8C:
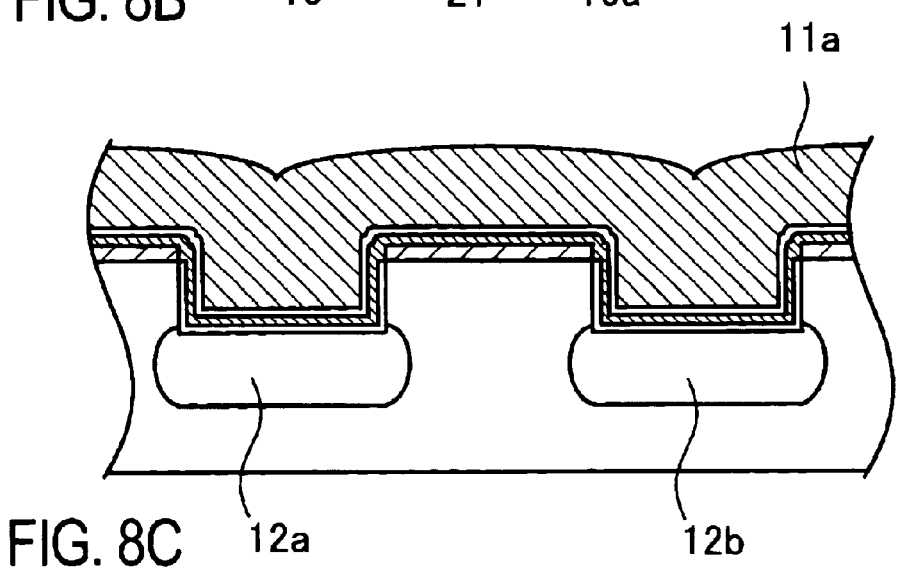
FIG. 8C is a sectional view of the non-volatile semiconductor memory in a polycide layer forming step in the method according to the second embodiment.

FIGS. 8A through 8C illustrate a method of manufacturing a non-volatile semiconductor memory in accordance with the second embodiment. FIG. 8A is a sectional view of the non-volatile semiconductor memory in an impurity diffusion layer forming step. FIG. 8B is a sectional view of the non-volatile semiconductor memory in a gate insulating film forming step. FIG. 8C is a sectional view of the non-volatile semiconductor memory in a polycide layer forming step. In FIGS. 8A through 8C, the same components as those shown in FIGS. 6A through 7C are denoted by the same reference numerals as those in FIGS. 6A through 7C.

A predetermined well is first formed on the p-type silicon semiconductor substrate 15, and device separation is carried out in the peripheral circuit region, through this step is not shown in the drawings.

A silicon oxide film of approximately 15 nm in thickness is then formed on the p-type silicon semiconductor substrate 15 by a known thermal oxidation technique, so that an upper surface insulating film 21 is formed as a third insulating film, as shown in FIG. 8A.

After the formation of the upper surface insulating film 21, the same procedures substantially the same as the first embodiment are carried out. More specifically, the photoresist 19 is formed on the p-type silicon semiconductor substrate 15 by a known photolithography technique. With the photoresist 19 being the mask, the upper surface insulating film 21 and the p-type silicon semiconductor substrate 15 are partially removed by an etching technique, so as to form the grooves 13a and 13b as well as the convexity 14.

With the photoresist 19 being the mask, arsenic ions are then implanted with an acceleration energy of approximately 50 keV. Here, the dose of arsenic ions is approximately $1 \times 10^{15}$ ions/cm$^2$ to $5 \times 10^{15}$ ions/cm$^2$. As a result, the impurity diffusion layers 12a and 12b are formed.

The photoresist 19 is then removed, and a silicon oxide film of approximately 10 nm in thickness is formed on the exposed p-type silicon semiconductor substrate 15 by a known thermal oxidation technique, so as to form the first insulating film 16a, as shown in FIG. 8B.

A silicon nitride film of approximately 10 nm in thickness is then formed on the first insulating film 16a by a known CVD technique, so as to form the charge capturing film 16b.

After that, the upper part of the charge capturing film 16b is subjected to a thermal treatment by a known thermal oxidation technique, in an atmosphere of oxygen at 900 to 950° C. for 30 to 60 minutes. As a result, the upper 10 nm of the charge capturing film 16b is oxidized and forms the second insulating film 16c.

In this manner, the surface part on the convexity 14 forms a three-layer structure in which the upper surface insulating film 21, the charge capturing film 16b, and the second insulating film 16c, are laminated in this order. The parts other than the surface part on the convexity 14 (i.e., the part by the side walls of the convexity 14 and the surface parts on the impurity diffusion layers 12a and 12b) has the same three-layer structure as the first embodiment, in which the first insulating film 16a, the charge capturing film 16b, and the second insulating film 16c, are laminated in this order.

The later steps are carried out in the same manner as in the first embodiment. More specifically, the formation of the polycide layer 11a is carried out by forming a polycrystalline silicon film and a tungsten silicide film on the entire surface by a CVD technique. After processing the polycide layer 11a, the impurity diffusion layers 12a and 12b are activated. At last, contact holes (not shown) are opened, and metal wirings are arranged.

In the non-volatile semiconductor memory formed in the above manner, the film thickness of the upper surface insulating film 21 on the upper surface of the convexity 14 is greater than the film thickness of the first insulating film 16a by the side walls of the convexity 14. Accordingly, in the channel region of the convexity 14, electrons can be kept from skipping the upper surface insulating film 21 and being captured in the charge capturing film 16b. Instead, electrons are selectively captured in the charge capturing film 16b by the side walls of the convexity 14. In this manner, the position control for the charge capturing regions formed in the charge capturing film 16b can be accurately performed, so that the charge capturing regions can be accurately positioned by the side walls of the convexity. Thus, a non-volatile semiconductor memory that performs stable and highly reliable operations can be obtained.

Next, the third embodiment of the present invention will be described. In the third embodiment, the same steps as the steps in the first embodiment shown in FIGS. 6A through 6C and FIG. 7A are carried out. The steps to be carried out after the step shown in FIG. 7A will be described below.

Figure 9A:
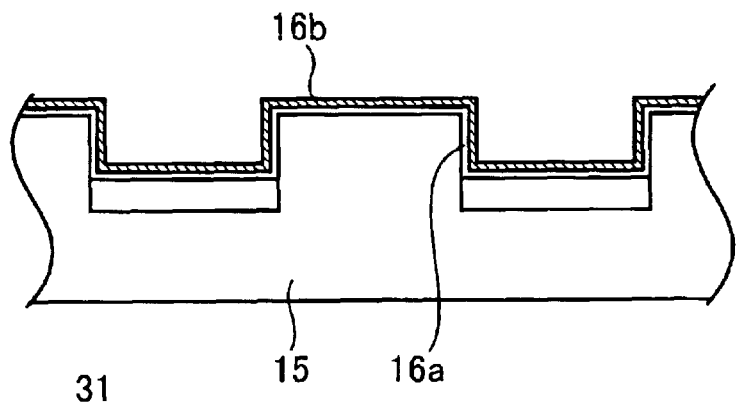
FIG. 9A is a sectional view of a non-volatile semiconductor memory in a step of forming a first insulating film and a charge capturing film in a non-volatile semiconductor memory manufacturing method according to a third embodiment of the present invention.
Figure 9B:
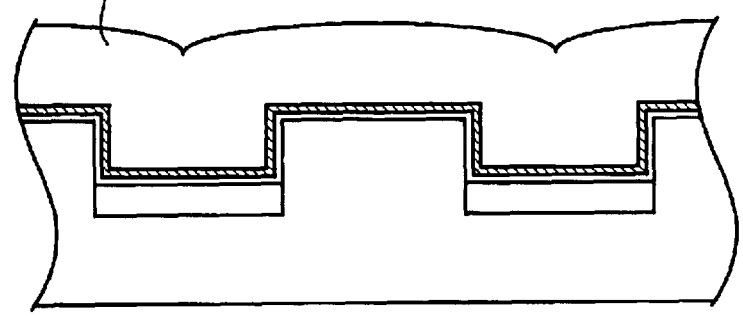
FIG. 9B is a sectional view of the non-volatile semiconductor memory in an oxide film forming step in the method according to the third embodiment.
Figure 9C:
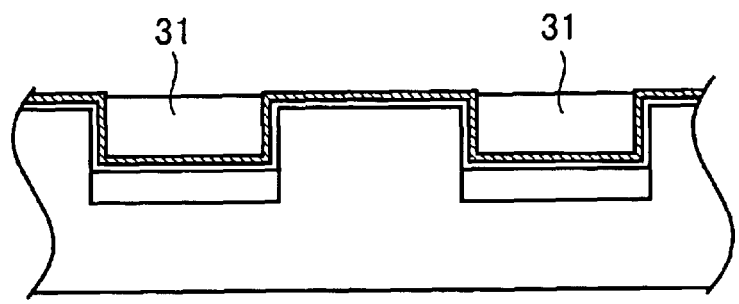
FIG. 9C is a sectional view of the non-volatile semiconductor memory in a first oxide film removing step in the method according to the third embodiment.
Figure 9D:
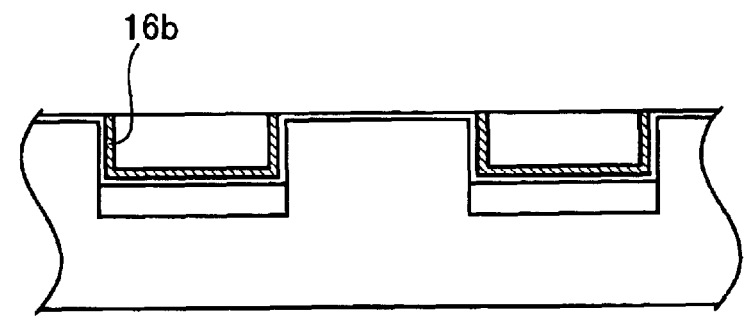
FIG. 9D is a sectional view of the non-volatile semiconductor memory in a charge capturing film removing step in the method according to the third embodiment.
Figure 10A:
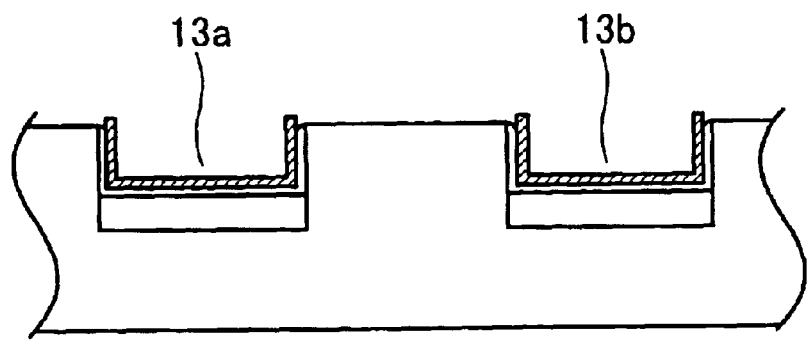
FIG. 10A is a sectional view of the non-volatile semiconductor memory in a second oxide film removing step in the method according to the third embodiment.
Figure 10B:
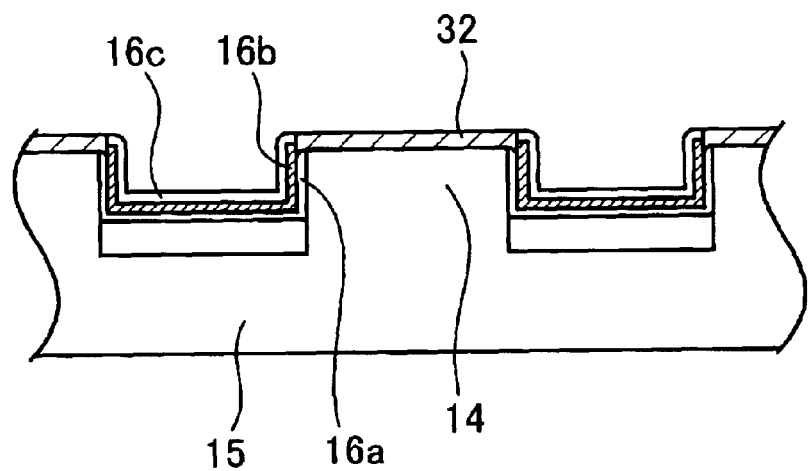
FIG. 10B is a sectional view of the non-volatile semiconductor memory in a gate insulating film forming step in the method according to the third embodiment.
Figure 10C:
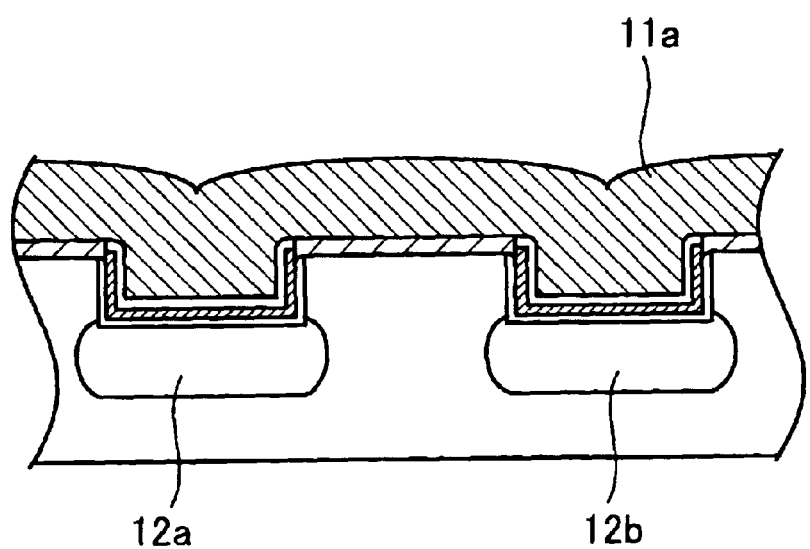
FIG. 10C is a sectional view of the non-volatile semiconductor memory in a polycide layer forming step in the method according to the third embodiment.

FIGS. 9A through 10C are sectional views of a non-volatile semiconductor memory in accordance with the third embodiment, illustrating a method of manufacturing the non-volatile semiconductor memory. More specifically, FIG. 9A illustrates a step of forming a first insulating film and a charge capturing film. FIG. 9B illustrates an oxide film forming step. FIG. 9C illustrates a first oxide film removing step. FIG. 9D illustrates a charge capturing film removing step. FIG. 10A illustrates a second oxide film removing step. FIG. 10B illustrates a gate insulating film forming step. FIG. 10C illustrates a polycide layer forming step. In FIGS. 9A through 10C, the same components as those shown in FIGS. 6A through 7C are denoted by the same reference numerals as those in FIGS. 6A through 7C.

After the photoresist 19 shown in FIG. 7A is removed, a silicon oxide film of approximately 10 nm is formed on the exposed p-type silicon semiconductor substrate 15 by a known thermal oxidation technique, so as to form the first insulating film 16a, as shown in FIG. 9A. A silicon nitride film of approximately 10 nm is then formed on the first insulating film 16a by a known CVD technique, so as to form the charge capturing film 16b.

An oxide film 31 of approximately 500 nm in thickness is next formed on the entire surface by a known CVD technique, as shown in FIG. 9B.

The oxide film 31 is then removed by a known CMP (Chemical Mechanical Polishing) technique, so that the charge capturing film 16b is exposed, as shown in FIG. 9C, with the silicon nitride film of the charge capturing film 16b serving as a stopper.

The exposed parts of the charge capturing film 16b are then removed by a known etching technique using a phosphoric acid solution, as shown in FIG. 9D.

The oxide film 31 inside the grooves 13a and 13b is next removed by a known etching technique using a hydrogen fluoride solution, as shown in FIG. 10A.

A silicon oxide film of approximately 20 nm in thickness is formed on the exposed p-type silicon semiconductor substrate 15 by a known thermal oxidation technique, so that an upper surface insulating film 32 is formed as a fourth insulating film on the upper surface of the convexity 14, as shown in FIG. 10B. At the same time, the upper part of the remaining charge capturing film 16b is partially oxidized to form the second insulating film 16c made of the silicon oxide film of approximately 2 nm to 5 nm in thickness. Accordingly, with the upper surface insulating film 32 being formed on the upper surface of the convexity 14, the parts other than the upper surface area of the convexity 14 have a three-layer structure consisting of the first insulating film 16a, the charge capturing film 16b, and the second insulating film 16c.

The later steps in the method according to the third embodiment are carried out in the same manner as in the method according to the first embodiment. More specifically, after the polycide layer 11a is formed and processed, the impurity diffusion layers 12a and 12b are activated, as shown in FIG. 10C. Finally, contact holes (not shown) are opened, and metal wirings are arranged.

In the non-volatile semiconductor memory formed in the above manner, the charge capturing film 16b does not exist on the upper surface of the convexity 14. Accordingly, electrons in the channel region are selectively captured in the charge capturing film 16b near the side walls of the convexity 14. In this manner, the position control for the charge capturing regions can be accurately performed by the above method. Thus, a non-volatile semiconductor memory that performs stable and highly reliable operations can be obtained.

Also, the upper surface insulating film 32 can be formed in a desired thickness so as to set a desired threshold value.

Next, the fourth embodiment of the present invention will be described. In the fourth embodiment, the same steps as those in the method according to the first embodiment shown in FIGS. 6A through 7B are carried out. The steps to be carried out after the step shown in FIG. 7B will be described below.

Figure 11A:
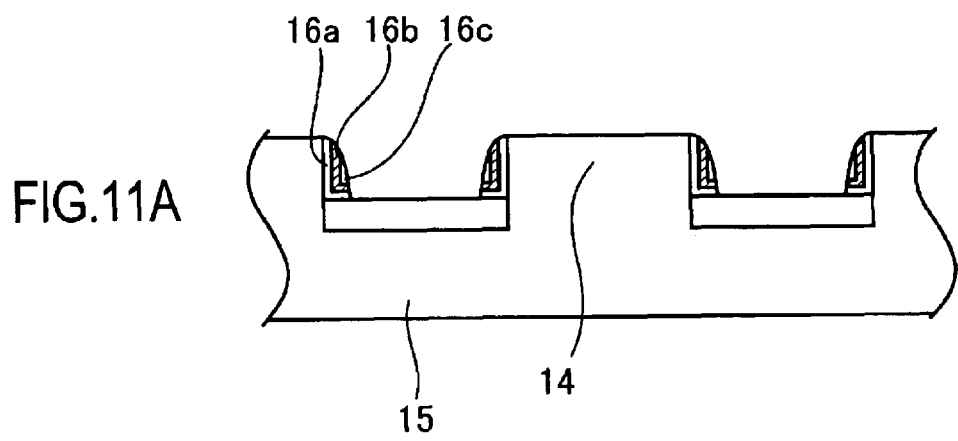
FIG. 11A is a sectional view of a non-volatile semiconductor memory in a gate insulating film removing step in a non-volatile semiconductor memory manufacturing method according to a fourth embodiment of the present invention.
Figure 11B:
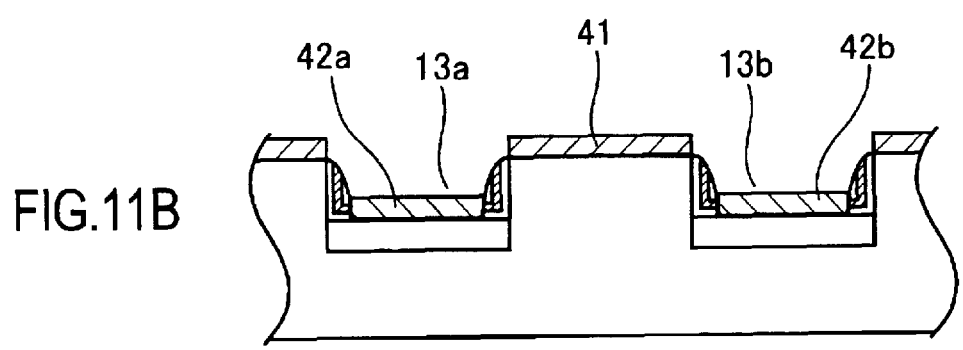
FIG. 11B is a sectional view of the non-volatile semiconductor memory in a step of forming an upper surface insulating film and bottom surface insulating films in the method according to the fourth embodiment.
Figure 11C:
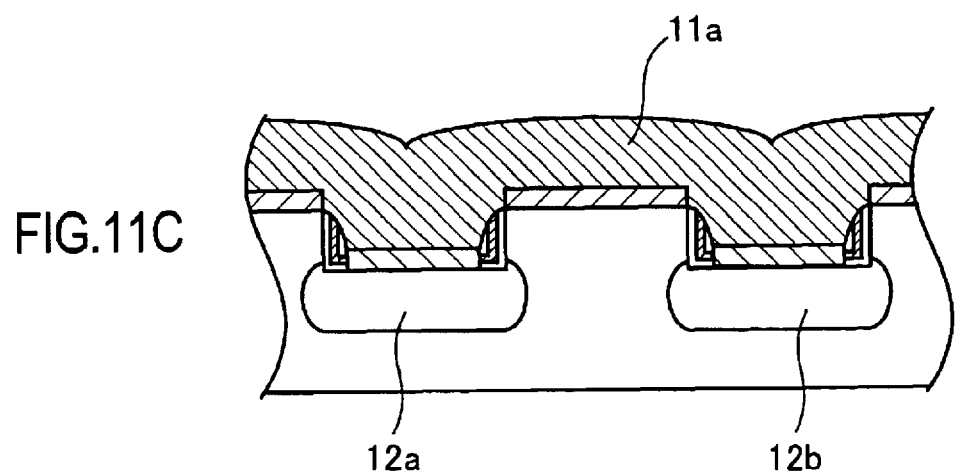
FIG. 11C is a sectional view of the non-volatile semiconductor memory in a polycide layer forming step in the method according to the fourth embodiment.

FIGS. 11A through 11C illustrate a method of manufacturing a non-volatile semiconductor memory in accordance with the fourth embodiment. More specifically, FIG. 11A is a sectional view of the non-volatile semiconductor memory in a gate insulating film removing step. FIG. 11B is a sectional view of the non-volatile semiconductor memory in a step of forming an upper surface insulating film and bottom surface insulating films. FIG. 11C is a sectional view of the non-volatile semiconductor memory in a polycide layer forming step. In FIGS. 11A through 11C, the same components as those shown in FIGS. 6A through 7C are denoted by the same reference numerals as those in FIGS. 6A through 7C.

The gate insulating film 16 shown in FIG. 7B is etched by a known etching technique, so that the entire surface of the p-type silicon semiconductor substrate 15 is exposed, as shown in FIG. 11A. As a result, only the parts by the side walls of the convexity 14 have a three-layer structure consisting of the first insulating film 16a, the charge capturing film 16b, and the second insulating film 16c.

A silicon oxide film of approximately 20 nm in thickness is next formed on the exposed p-type silicon semiconductor substrate 15 by a known thermal oxidation technique, as shown in FIG. 11B. As a result, an upper surface insulating film 41 is formed on the upper surface of the convexity 14, and bottom surface insulating films 42a and 42b are formed on the bottom surfaces of the grooves 13a and 13b. The upper surface insulating film 41 and the bottom surface insulating films 42a and 42b each serve as a fourth insulating film.

The later steps are the same as those in the method according to the first embodiment. More specifically, the polycide layer 11a is formed and processed, and the impurity diffusion layers 12a and 12b are activated, as shown in FIG. 11C. Finally, contact holes (not shown) are opened, and metal wirings are arranged.

In the non-volatile semiconductor memory formed in the above manner, the charge capturing film 16b exists by the side walls of the convexity 14. At the same time, the bottom surface insulating films 42a and 42b having a smaller capacity than a three-layer structure are formed on the upper surfaces of the impurity diffusion layers 12a and 12b. Accordingly, the parasitic capacity between the gate electrodes 11 formed by the polycide layer 11a shown in FIGS. 1 through 3 and the impurity diffusion layers 12a and 12b that serve as the source and drain is reduced. Thus, a non-volatile semiconductor memory that performs high-speed and yet stable operations can be obtained.

Also, since the charge capturing film 16b does not exist on the upper surface of the convexity 14, electrons are selectively captured in the charge capturing film 16b near the side walls of the convexity 14, and accurate position control for the charge capturing regions can be performed.

Next, the fifth embodiment of the present invention will be described. In the fifth embodiment, the formation of a non-volatile semiconductor memory is carried out in the same manner as the method according to the second embodiment, until the step shown in FIG. 8B. The steps to be carried out after the step shown in FIG. 8B will be described below.

Figure 12A:
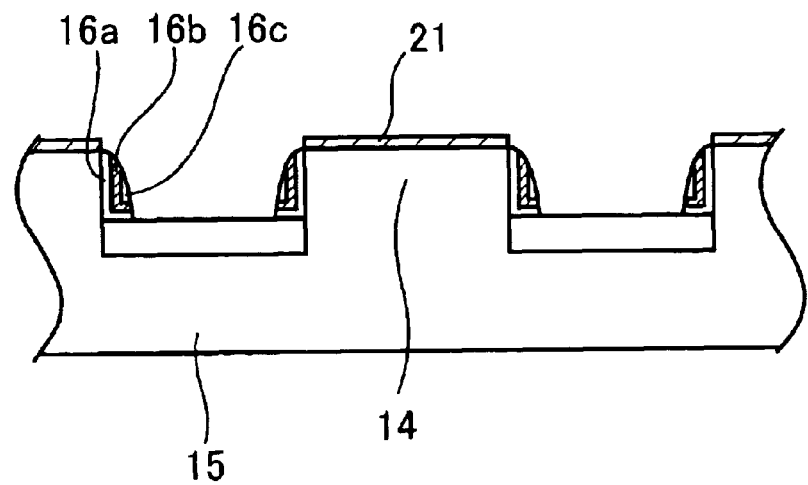
FIG. 12A is a sectional view of a non-volatile semiconductor memory in a gate insulating film removing step in a non-volatile semiconductor memory manufacturing method according to a fifth embodiment of the present invention.
Figure 12B:
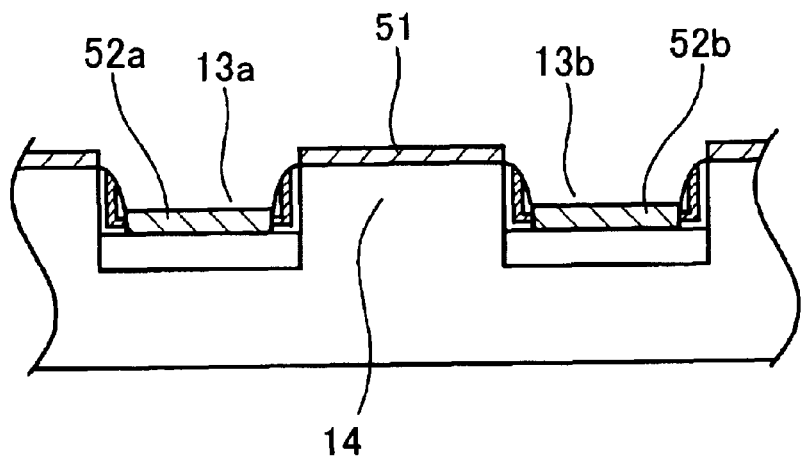
FIG. 12B is a sectional view of the non-volatile semiconductor memory in a step of forming an upper surface insulating film and bottom surface insulating films in the method according to the fifth embodiment.
Figure 12C:
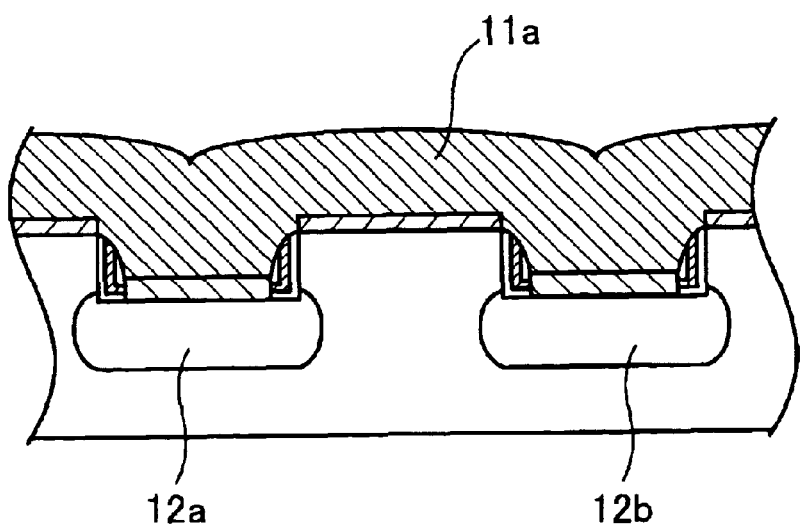
FIG. 12C is a sectional view of the non-volatile semiconductor memory in a polycide layer forming step in the method according to the fifth embodiment.

FIGS. 12A through 12C illustrate a method of manufacturing a non-volatile semiconductor memory in accordance with the fifth embodiment. More specifically, FIG. 12A is a sectional view of the non-volatile semiconductor memory in a gate insulating film removing step. FIG. 12B is a sectional view of the non-volatile semiconductor memory in a step of forming an upper surface insulating film and bottom surface insulating films. FIG. 12C is a sectional view of the non-volatile semiconductor memory in a polycide layer forming step. In FIGS. 12A through 12C, the same components as those shown in FIGS. 8A through 8C are denoted by the same reference numerals as those in FIGS. 8A through 8C.

After the gate insulating film forming step shown in FIG. 8B, etching is performed on the entire surface by a known etching technique, until the p-type silicon semiconductor substrate 15 is exposed, as shown in FIG. 12A. As a result, only the parts by the side walls of the convexity 14 have a three-layer structure consisting of the first insulating film 16a, the charge capturing film 16b, and the second insulating film 16c. Here, approximately 5 nm of the upper surface insulating film 21 formed as the third insulating film remains on the upper surface of the convexity 14.

A silicon oxide film of approximately 20 nm in thickness is next formed on the exposed p-type silicon semiconductor substrate 15 by a known thermal oxidation technique, as shown in FIG. 12B. At this point, the upper surface insulating film 21 is partially oxidized as well. As a result, an upper surface insulating film 51 is formed as a fourth insulating film on the upper surface of the convexity 14. Also, bottom surface insulating films 52a and 52b are formed as the fourth insulating film on the bottom surfaces of the grooves 13a and 13b.

The later steps are carried out in the same manner as in the second embodiment. More specifically, the polycide layer 11a is formed and processed, and the impurity diffusion layers 12a and 12b are activated, as shown in FIG. 12C. Finally, contact holes (not shown) are opened, and metal wirings are arranged.

In the non-volatile semiconductor memory formed in the above manner, the gate insulating film by the side walls of the convexity 14, the upper surface insulating film 51, and the bottom surface insulating films 52a and 52b, are formed independently of one another. Accordingly, the upper insulating film 51 can be formed in a desired thickness, so as to set a desired threshold value.

Also, the bottom surface insulting films 52a and 52b having a smaller capacity than a three-structure can be formed on the upper surface of the impurity diffusion layers 12a and 12b. Thus, the parasitic capacity between the gate electrodes and the source and drain is reduced, and a non-volatile semiconductor memory that performs high-speed and yet stable operations can be obtained.

Further, as the charge capturing film 16b remains only in the vicinities of the side walls of the convexity 14, the position control for the charge capturing regions can be performed more accurately.

As described above with respect to the second to fifth embodiments, the channel region of a non-volatile semiconductor memory is formed into a convex shape, and charge capturing regions are formed within the gate insulating film 16 in the vicinities of the side walls of the convexity 14. In this manner, an effective channel length is secured despite a reduction in the device size. Thus, a non-volatile semiconductor memory that can be easily reduced in size while maintaining a high reliability can be obtained.

Although the channel region in a non-volatile semiconductor memory is formed in a convex shape in the foregoing embodiments, it may have a concave shape. In the following, the structure of a non-volatile semiconductor memory having a concave channel region and a method of manufacturing such a non-volatile semiconductor memory will be described below as a sixth embodiment of the present invention.

Figure 13:
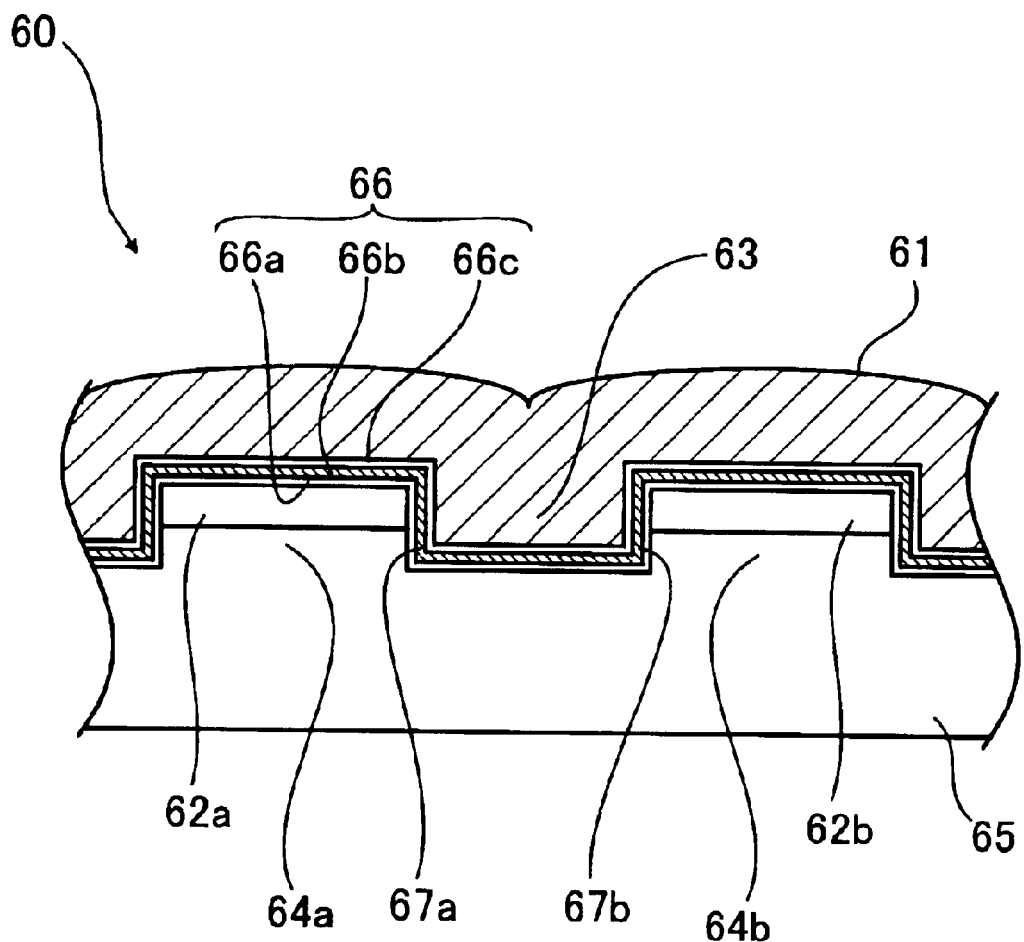
FIG. 13 illustrates an example of a non-volatile semiconductor memory according to a sixth embodiment of the present invention.

FIG. 13 illustrates an example of the non-volatile semiconductor memory according to the sixth embodiment.

A non-volatile semiconductor memory 60 includes a p-type silicon semiconductor substrate 65 having a concavity with which a groove 63 is formed. Impurity diffusion layers 62a and 62b are formed on two convexity 64a and 64b that form the concavity.

A gate insulating film 66 is formed on the p-type silicon semiconductor substrate 65. This gate insulating film 66 has a three-structure layer in which a first insulating film 66a made of a silicon oxide film, a charge capturing film 66b made of a silicon nitride film, and a second insulating film 66c made of a silicon oxide film, are laminated in this order. Gate electrodes 61 are formed on the gate insulating film 66. The concavity formed in the p-type silicon semiconductor substrate 65 serves as the channel region of the non-volatile semiconductor memory 60.

In this non-volatile semiconductor memory 60, the charge capturing regions are formed at the side wall parts of the convexities 64a and 64b in the charge capturing film 66b of the gate insulating film 66 through a predetermined voltage application. The non-volatile semiconductor memory 60 has two bit regions: a left bit region 67a on the side of the convexity 64a and a right bit region 67b on the side of the convexity 64b, as shown in FIG. 13. In the non-volatile semiconductor memory 60, read and write of 2-bit information are performed. More specifically, 1-bit information read and write are performed in each of the left bit region 67a and the right bit region 67b.

Figure 14A:
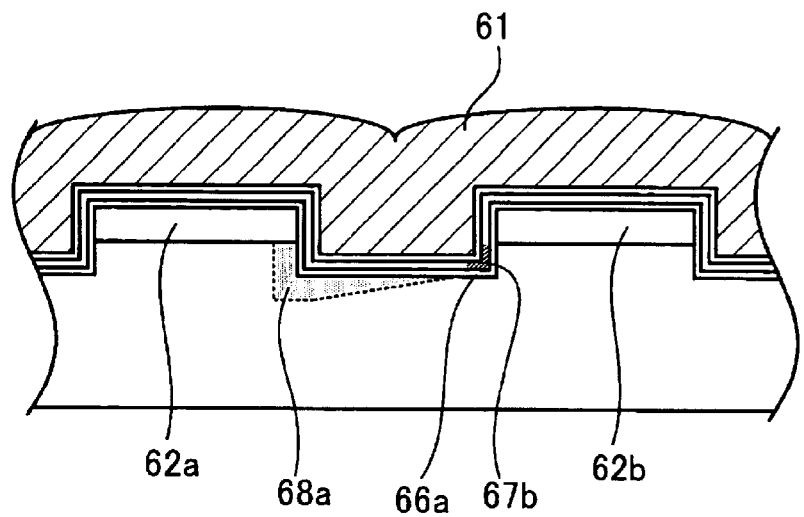
FIG. 14A illustrates a write operation of the non-volatile semiconductor memory according to the sixth embodiment.
Figure 14B:
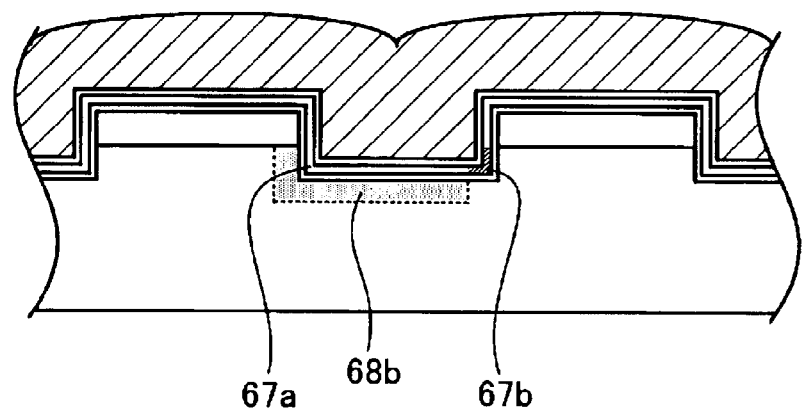
FIG. 14B illustrates a read operation of the non-volatile semiconductor memory according to the sixth embodiment.
Figure 14C:
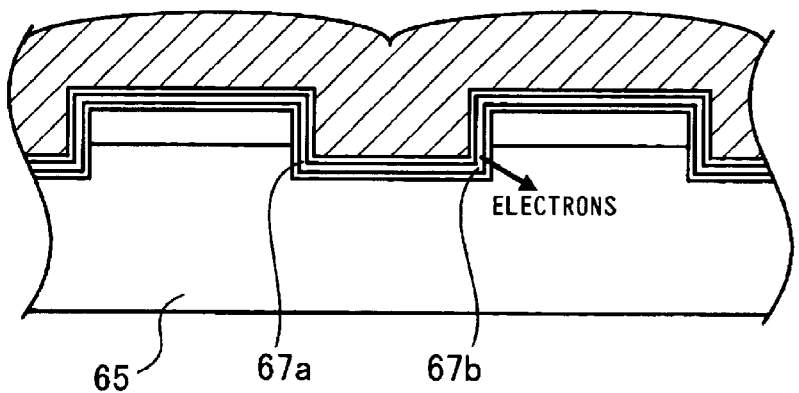
FIG. 14C illustrates an erase operation of the non-volatile semiconductor memory according to the sixth embodiment.

FIGS. 14A through 14C illustrate an operation of the non-volatile semiconductor memory in accordance with the sixth embodiment of the present invention. More specifically, FIG. 14A illustrates a write operation, FIG. 14B illustrates a read operation, and FIG. 14C illustrates an erase operation. In FIGS. 14A and 14B, electrons are captured in the right bit region 67b.

First, a case of writing information in the right bit region 67b will be described. In this case, the voltage to be applied to the impurity diffusion layer 62a as the source is set at 0 V, and a positive voltage is applied to the impurity diffusion layer 62b as the drain. As a result of this, an inversion layer 68a is formed between the impurity diffusion layers 62a and 62b, as shown in FIG. 14A. The channel hot electrons generated in the vicinity of the impurity diffusion layer 62b are then captured in the right bit region 67b, skipping the first insulating film 66a.

In a case of reading information from the right bit region 67b, the voltages reversed from the voltages in the case of writing are applied to the source and drain. By doing so, an inversion layer 68b is formed between the impurity diffusion layers 62a and 62b.

If electrons are captured in the right bit region 67b at this point, the inversion layer 68b is not formed in the vicinity of the right bit region 67b, as shown in FIG. 14B. As a result, the current does not flow between the source and drain. On the other hand, if electrons are not captured in the right bit region 67b, the inversion layer 68b is formed also in the vicinity of the right bit region 67b, and the current flows between the source and drain, although such a case is not shown in the drawings.

Information read and write can be performed on the left bit region 67a in the same manner as in the case of the right bit region 67b. In doing so, the voltages reversed from the voltages applied in the information read and write operations performed on the right bit region 67b are applied.

In a case of erasing information that has been written in the charge capturing regions, a negative high voltage is applied to the gate electrodes 61, and a positive high voltage is applied to the p-type silicon semiconductor substrate 65. By doing so, the electrons captured in the right bit region 67b are removed from the right bit region 67b and introduced into the p-type silicon semiconductor substrate 65, as shown in FIG. 14C. Here, the voltages applied to the source and drain are open voltages or 0 V. In a case of erasing information from the left bit region 67a, the same process as the above should be carried out.

In another method of erasing information, a negative high voltage is applied to the gate electrodes 61, and a positive voltage is applied to the impurity diffusion layer 62b. Here, the voltage to be applied to the impurity diffusion layer 62a is an open voltage or 0 V. When information written in the left bit region 67a is to be erased in the same manner as this, a negative high voltage is applied to the gate electrodes 61, and a positive voltage is applied to the impurity diffusion layer 62a.

When information written in the left bit region 67a and information written in the right bit region 67b are to be erased at the same time, a negative high voltage should be applied to the gate electrode 61, and a positive voltage should be applied to both of the impurity diffusion layers 62a and 62b.

Figure 15A:
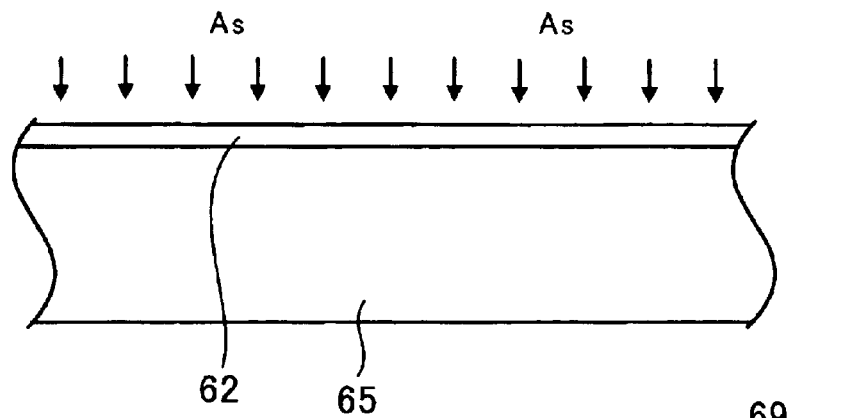
FIG. 15A is a sectional view of the non-volatile semiconductor memory in an impurity diffusion layer forming step of a non-volatile semiconductor memory manufacturing method according to the sixth embodiment.
Figure 15B:
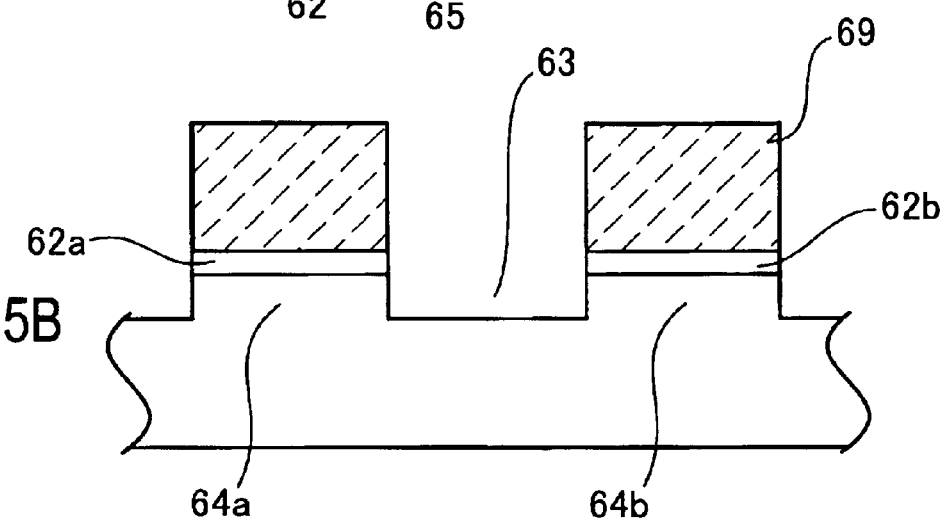
FIG. 15B is a sectional view of the non-volatile semiconductor memory in a convexity forming step in the method according to the sixth embodiment.
Figure 15C:
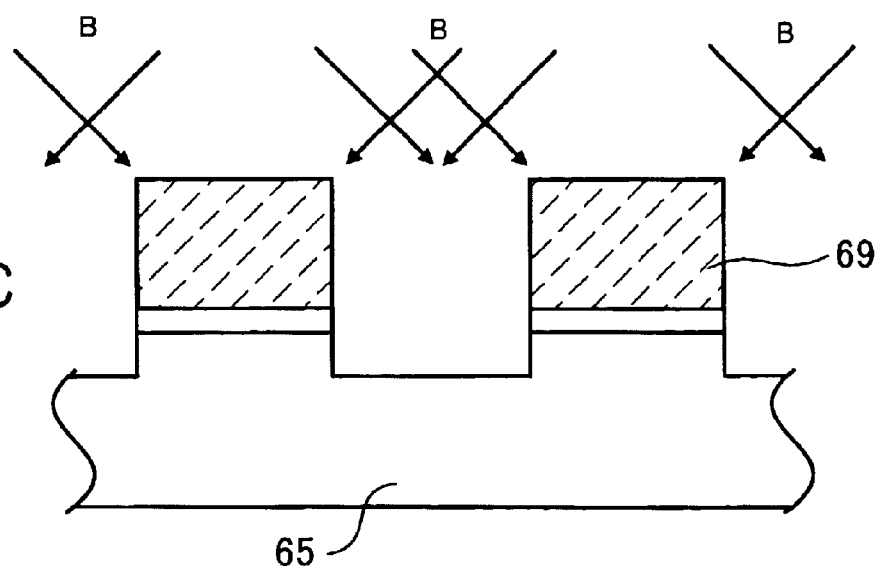
FIG. 15C is a sectional view of the non-volatile semiconductor memory in an ion implanting step in the method according to the sixth embodiment.
Figure 16A:
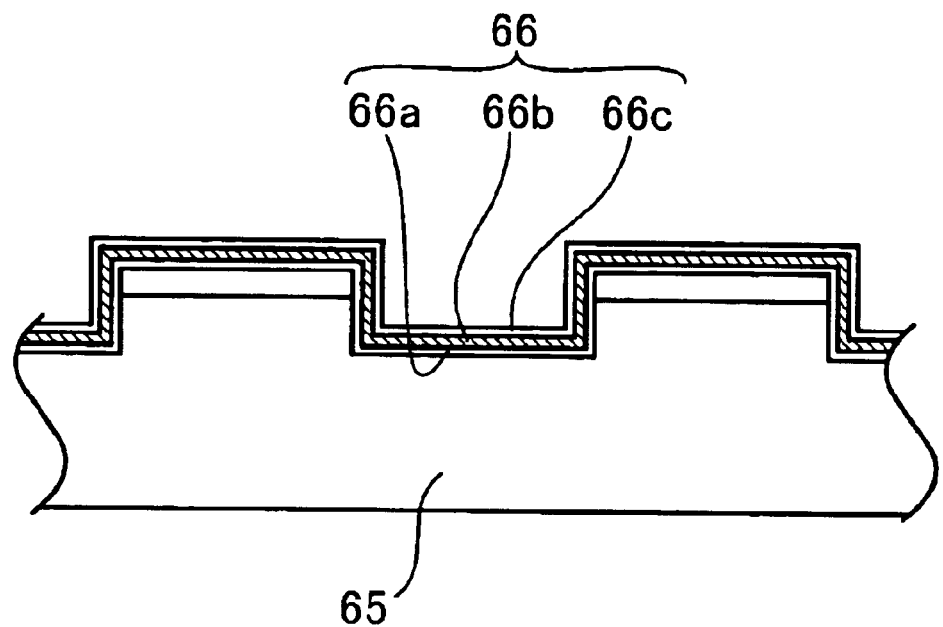
FIG. 16A is a sectional view of the non-volatile semiconductor memory in a gate insulating film forming step in the method according to the sixth embodiment.
Figure 16B:
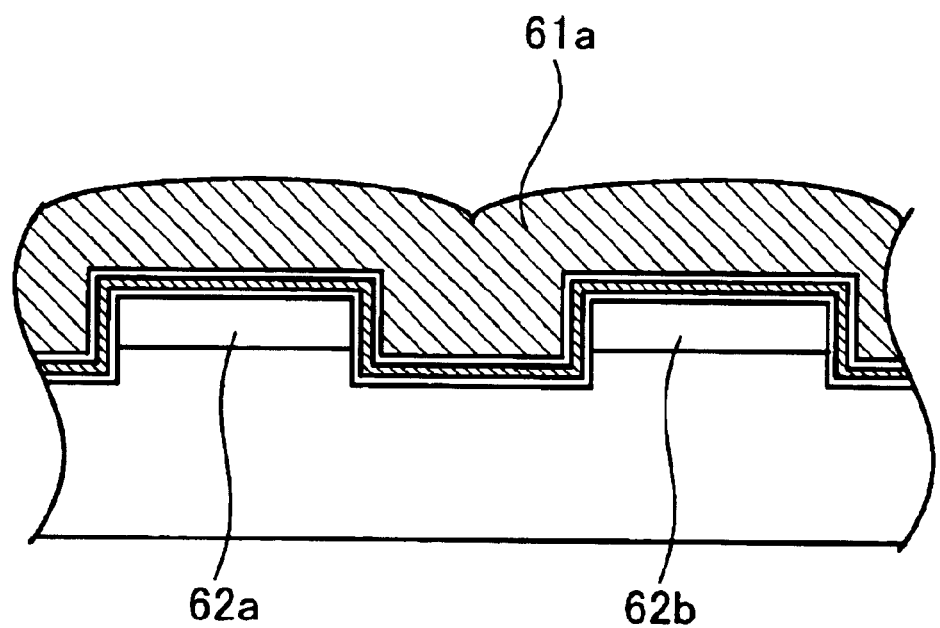
FIG. 16B is a sectional view of the non-volatile semiconductor memory in a polycide layer forming step in the method according to the sixth embodiment.

FIGS. 15A through 16B illustrate a method of manufacturing the non-volatile semiconductor memory according to the sixth embodiment of the present invention. More specifically, FIG. 15A is a sectional view of the non-volatile semiconductor memory in an impurity diffusion layer forming step. FIG. 15B is a sectional view of the non-volatile semiconductor memory in a convexity forming step. FIG. 15C is a sectional view of the non-volatile semiconductor memory in an ion implanting step. FIG. 16A is a sectional view of the non-volatile semiconductor memory in a gate insulating film forming step. FIG. 16B is a sectional view of the non-volatile semiconductor memory in a polycide layer forming step.

First, a predetermined well is formed on the p-type silicon semiconductor substrate 65, and device separation is carried out in the peripheral circuit region (not shown).

Next, arsenic ions are implanted onto the entire surface of the p-type silicon semiconductor substrate 65 by a known ion implantation technique, as shown in FIG. 15A. This ion implantation is carried out with an acceleration energy of approximately 50 KeV, and the dose of ions is approximately $1 \times 10^{15}$ ions/cm$^2$ to $5 \times 10^{15}$ ions/cm$^2$. As a result, an impurity diffusion layer 62 that is to serve as the source and drain and the bit lines for the memory cells is formed.

Next, a photoresist 69 is formed on the p-type silicon semiconductor substrate 65 by a known photolithography technique, as shown in FIG. 15B. The parts of the p-type silicon semiconductor substrate 65 is then selectively removed by an etching technique, with the photoresist 69 being the mask, so as to form the groove 63. As a result, the convexities 64a and 64b and the impurity diffusion layers 62a and 62b appear in the p-type silicon semiconductor substrate 65.

The groove 63 has a width of approximately 0.3 μm and a depth of approximately 0.15 μm. However, this width and depth are merely an example, and may be arbitrarily changed depending on what the non-volatile semiconductor memory is to be used for.

With the photoresist 69 being the mask, boron ions are implanted on the p-silicon semiconductor substrate 65 in an inclined state, as shown in FIG. 15C. The ion implantation is carried out with an acceleration energy of approximately 30 keV to 90 keV, and the dose of arsenic ions is approximately $5 \times 10^{11}$ ions/cm$^2$ to $5 \times 10^{12}$ ions/cm$^2$.

The photoresist 69 is then removed, and a silicon oxide film of approximately 10 nm in thickness is formed on the exposed p-type silicon semiconductor substrate 65 by a known thermal oxidation technique, as shown in FIG. 16A. In this manner, the first insulating film 66a is formed.

On the first insulating film 66a, a silicon nitride film of approximately 10 nm in thickness is formed by a known CVD (Chemical Vapor Deposition) technique, so as to form the charge capturing film 66b.

After that, the upper part of the charge capturing film 66b is subjected to a thermal treatment by a known thermal oxidation technique, in an atmosphere of oxygen at 900 to 950° C. for 30 to 60 minutes. As a result, the upper 10 nm of the charge capturing film 66b is oxidized and forms the second insulating film 66c. In this manner, the gate insulating film 66 having a three-layer structure that consists of the first insulating film 66a, the charge capturing film 66b, and the second insulating film 66c, is formed.

The polycide layer 61a is next formed on the entire surface by a known CVD technique, as shown in FIG. 16B. The formation of this polycide layer 61a is carried out by forming a polycrystalline silicon film of approximately 300 nm in thickness that contains approximately $2 \times 10^{20}$ atoms/cm$^3$ to $6 \times 10^{20}$ atoms/cm$^3$ of phosphorous (P), and a tungsten silicide film of approximately 200 nm in thickness.

The polycide layer 61a is then processed by a known photolithography technique and an etching technique, so as to form the gate electrodes 61 shown in FIG. 13. After that, an impurity activating thermal treatment is carried out by a known thermal diffusion technique, so as perform diffusion and activation on the impurity diffusion layers 62a and 62b.

At last, contact holes (not shown) are opened, and metal wirings are arranged.

In the above explanation, the ion implantation of boron ions shown in FIG. 15C is carried out to adjust the impurity concentration in the convexities 64a and 64b. Therefore, these steps may be carried out when necessary, and the order of the steps is not limited to the above. For instance, the ion implanting step shown in FIG. 16A may be carried out before the formation of the gate insulating film 66. In such a case, boron ions are implanted onto the p-type silicon semiconductor substrate 65 in a tilting state.

As described above, the channel region of the non-volatile semiconductor memory 60 has a concave shape, and the charge capturing regions are formed within the gate insulating film 66 in the vicinities of the side walls of the convexities 64a and 64b. Accordingly, an effective channel length can be maintained despite a reduction in the device size. Thus, a small-sized non-volatile semiconductor memory having a high reliability can be obtained.

In the following, seventh to eleventh embodiments of the present invention will be described as modifications of the sixth embodiment, with reference to the accompanying drawings.

First, the seventh embodiment will be described.

FIGS. 17A through 17D illustrate a method of manufacturing a non-volatile semiconductor memory in accordance with the seventh embodiment. FIG. 17A is a sectional view of the non-volatile semiconductor memory in a step of forming impurity diffusion layers and upper surface insulating films. FIG. 17B is a sectional view of the non-volatile semiconductor memory in a convexity forming step. FIG. 17C is a sectional view of the non-volatile semiconductor memory in a gate insulating film forming step. FIG. 17D is a sectional view of the non-volatile semiconductor memory in a polycide layer forming step. In FIGS. 17A through 17D, the same components as those shown in FIGS. 15A through 16B are denoted by the same reference numerals as those in FIGS. 15A through 16B.

A predetermined well is first formed on the p-type silicon semiconductor substrate 65, and device separation is carried out in the peripheral circuit region, through this step is not shown in the drawings.

Arsenic ions are then implanted onto the entire surface of the p-type silicon semiconductor substrate 65 by a known ion implantation technique, so that the impurity diffusion layer 62 is formed as shown in FIG. 17A. This ion implantation is carried out with an acceleration energy of approximately 50 keV, and the dose of arsenic ions is approximately $1 \times 10^{15}$ ions/cm$^2$ to $5 \times 10^{15}$ ions/cm$^2$.

After the formation of the impurity diffusion layer 62, a silicon oxide film of approximately 15 nm in thickness is formed on the p-type silicon semiconductor substrate 65 by a known thermal oxidation technique, so that an upper surface insulating film 71 is formed as a third insulating film.

The photoresist 69 is then formed on the p-type silicon semiconductor substrate 65 by a known photolithography, as shown in FIG. 17B. With photoresist 69 being the mask, parts of the upper surface insulating film 71 and the p-type silicon semiconductor substrate 65 are selectively removed by an etching technique, so as to form the groove 63. As a result, the convexities 64a and 64b, upper surface insulating films 71a and 71b, and the impurity diffusion layers 62a and 62b, are formed on the p-type silicon semiconductor substrate 65.

The photoresist 69 is then removed, and a silicon oxide film of approximately 10 nm in thickness is formed on the exposed p-type silicon semiconductor substrate 65 by a known thermal oxidation technique, so as to form the first insulating film 66a, as shown in FIG. 17C.

A silicon nitride film of approximately 10 nm in thickness is then formed on the first insulating film 66a by a known CVD technique, so as to form the charge capturing film 66b.

After that, the upper part of the charge capturing film 66b is subjected to a thermal treatment by a known thermal oxidation technique, in an atmosphere of oxygen at 900 to 950° C. for 30 to 60 minutes. As a result, the upper 10 nm of the charge capturing film 66b is oxidized and forms the second insulating film 66c.

In this manner, the surface part on the convexities 64a and 64b form a three-layer structure in which the upper surface insulating films 71a and 71b, the charge capturing film 66b, and the second insulating film 66c, are laminated in this order. The parts other than the surface part on the convexities 64a and 64b (i.e., the part by the side walls of the convexities 64a and 64b and the surface parts on the impurity diffusion layers 62a and 62b) has the same three-layer structure as the sixth embodiment, in which the first insulating film 66a, the charge capturing film 66b, and the second insulating film 66c, are laminated in this order.

The later steps are carried out in the same manner as in the sixth embodiment. More specifically, after the polycide layer 61a is formed and processed, the impurity diffusion layers 62a and 62b are activated. At last, contact holes (not shown) are opened, and metal wirings are arranged.

In the non-volatile semiconductor memory formed in the above manner, the film thickness of the upper surface insulating films 71a and 71b is greater than the film thickness of the first insulating film 66a in the channel region. In this manner, the parasitic capacity between the gate electrodes and the source and drain can be reduced, and a non-volatile semiconductor memory that performs high-speed and yet stable operations can be obtained.

Next, the eighth embodiment of the present invention will be described. In the eighth embodiment, the same steps as the steps in the sixth embodiment shown in FIGS. 15A and 15B are carried out. The steps to be carried out after the step shown in FIG. 15B will be described below.

Figure 18A:
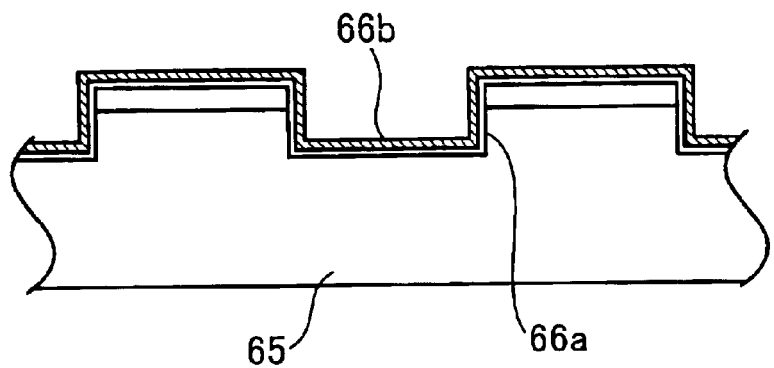
FIG. 18A is a sectional view of a non-volatile semiconductor memory in a step of forming a first insulating film and a charge capturing film in a non-volatile semiconductor memory manufacturing method according to an eighth embodiment of the present invention.
Figure 18B:
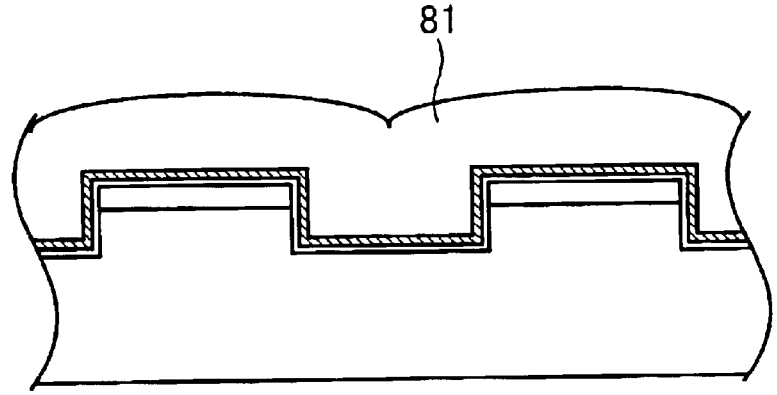
FIG. 18B is a sectional view of the non-volatile semiconductor memory in an oxide film forming step in the method according to the eighth embodiment.
Figure 18C:
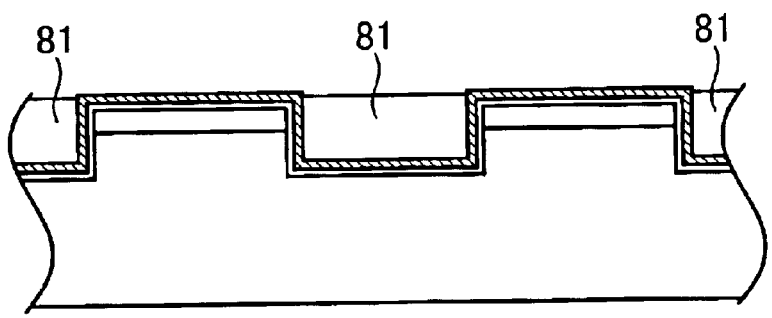
FIG. 18C is a sectional view of the non-volatile semiconductor memory in a first oxide film removing step in the method according to the eighth embodiment.
Figure 18D:
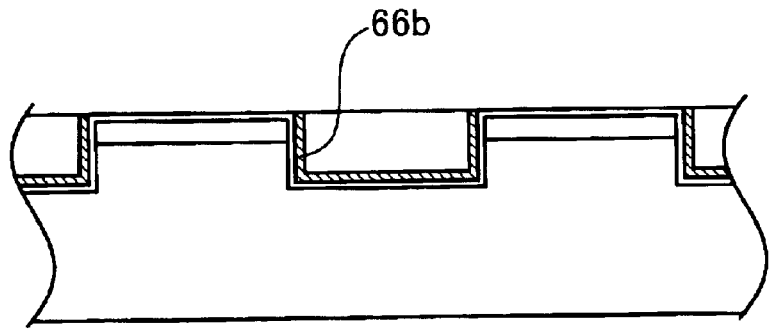
FIG. 18D is a sectional view of the non-volatile semiconductor memory in a charge capturing film removing step in the method according to the eighth embodiment.
Figure 19A:
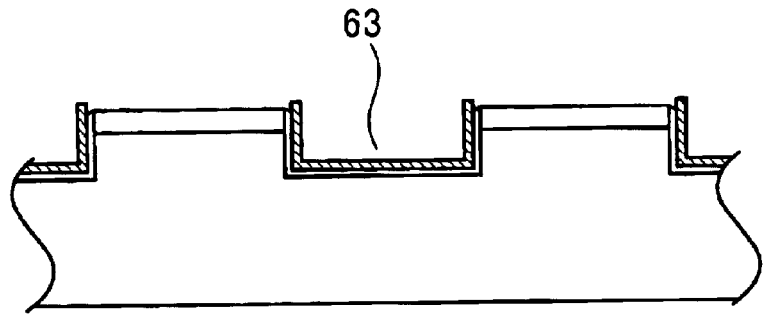
FIG. 19A is a sectional view of the non-volatile semiconductor memory in a second oxide film removing step in the method according to the eighth embodiment.
Figure 19B:
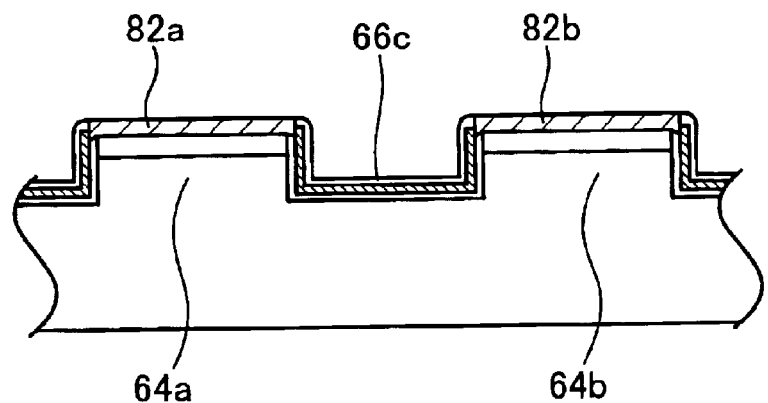
FIG. 19B is a sectional view of the non-volatile semiconductor memory in a gate insulating film forming step in the method according to the eighth embodiment.
Figure 19C:
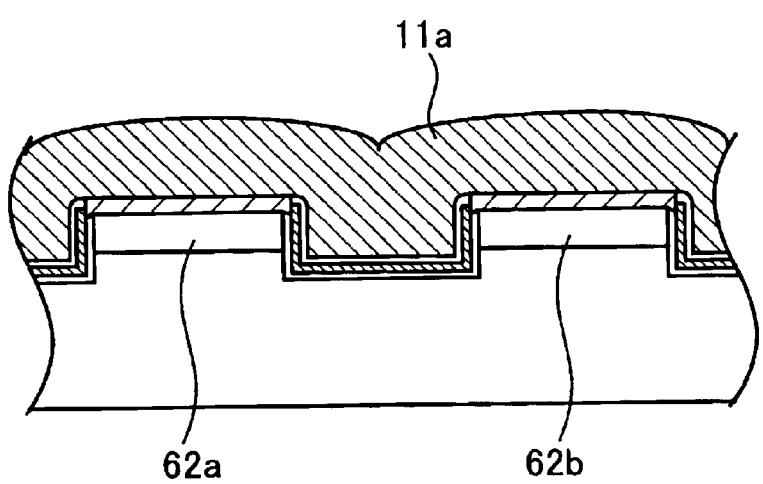
FIG. 19C is a sectional view of the non-volatile semiconductor memory in a polycide layer forming step in the method according to the eighth embodiment.

FIGS. 18A through 19C are sectional views of a non-volatile semiconductor memory in accordance with the eighth embodiment, illustrating a method of manufacturing the non-volatile semiconductor memory. More specifically, FIG. 18A illustrates a step of forming a first insulating film and a charge capturing film. FIG. 18B illustrates an oxide film forming step. FIG. 18C illustrates a first oxide film removing step. FIG. 18D illustrates a charge capturing film removing step. FIG. 19A illustrates a second oxide film removing step. FIG. 19B illustrates a gate insulating film forming step. FIG. 19C illustrates a polycide film forming step. In FIGS. 18A through 19C, the same components as those shown in FIGS. 15A through 16B are denoted by the same reference numerals as those in FIGS. 15A through 16B.

After the photoresist 69 shown in FIG. 15B is removed, a silicon oxide film of approximately 10 nm is formed on the exposed p-type silicon semiconductor substrate 65 by a known thermal oxidation technique, so as to form the first insulating film 66a, as shown in FIG. 18A. A silicon nitride film of approximately 10 nm is then formed on the first insulating film 66a by a known CVD technique, so as to form the charge capturing film 66b.

An oxide film 81 of approximately 700 nm in thickness is next formed on the entire surface by a known CVD technique, as shown in FIG. 18B.

The oxide film 81 is then removed by a known CMP technique, so that the charge capturing film 66b is exposed, as shown in FIG. 18C, with the silicon nitride film of the charge capturing film 66b serving as a stopper.

The exposed parts of the charge capturing film 66b are then removed by a known etching technique using a phosphoric acid solution, as shown in FIG. 18D.

The oxide film 81 inside the groove 63 is next removed by a known etching technique using a hydrogen fluoride solution, as shown in FIG. 19A.

A silicon oxide film of approximately 15 nm in thickness is then formed on the exposed p-type silicon semiconductor substrate 65 by a known thermal oxidation technique, so that upper surface insulating films 82a and 82b are formed as a fourth insulating film on the upper surfaces of the convexities 64a and 64b, as shown in FIG. 19B. At the same time, the upper part of the remaining charge capturing film 66b is partially oxidized to form the second insulating film 66c made of the silicon oxide film of approximately 5 nm in thickness.

Accordingly, with the upper surface insulating films 82a and 82b being formed on the upper surfaces of the convexities 64a and 64b, the parts other than the upper surface areas of the convexities 64a and 64b have a three-layer structure consisting of the first insulating film 66a, the charge capturing film 66b, and the second insulating film 66c, which is the same as the structure of the sixth embodiment.

The later steps in the method according to the eighth embodiment are carried out in the same manner as in the method according to the sixth embodiment. More specifically, after the polycide layer 61a is formed and processed, the impurity diffusion layers 62*a* and 62*b* are activated, as shown in FIG. 19C. Finally, contact holes (not shown) are opened, and metal wirings are arranged.

In the non-volatile semiconductor memory formed in the above manner, the upper surface insulating films 82*a* and 82*b* are silicon oxide films. Accordingly, the parasitic capacity between the gate electrodes and the source and drain is reduced, and a non-volatile semiconductor memory that performs high-speed and yet stable operations can be obtained.

Next, the ninth embodiment of the present invention will be described. In the ninth embodiment, the same steps as those in the method according to the sixth embodiment shown in FIGS. 15A through 15C and FIG. 16A are carried out. The steps to be carried out after the step shown in FIG. 16A will be described below.

Figure 20A:
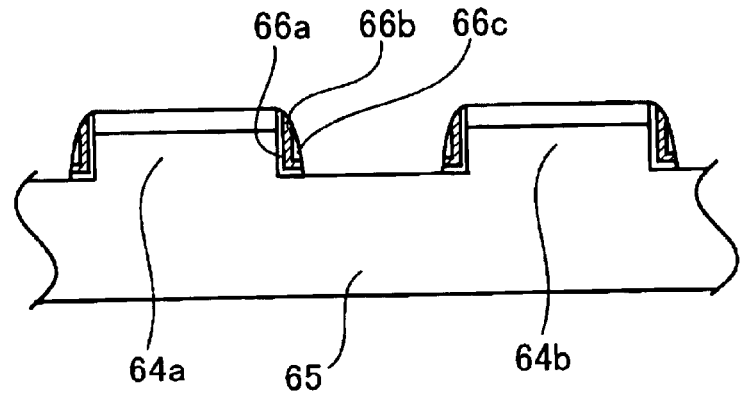
FIG. 20A is a sectional view of a non-volatile semiconductor memory in a gate insulating film removing step in a non-volatile semiconductor memory manufacturing method according to a ninth embodiment of the present invention.
Figure 20B:
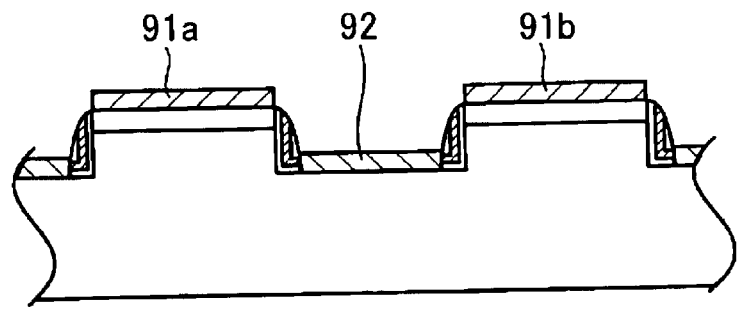
FIG. 20B is a sectional view of the non-volatile semiconductor memory in a step of forming upper surface insulating films and a bottom surface insulating film in the method according to the ninth embodiment.
Figure 20C:
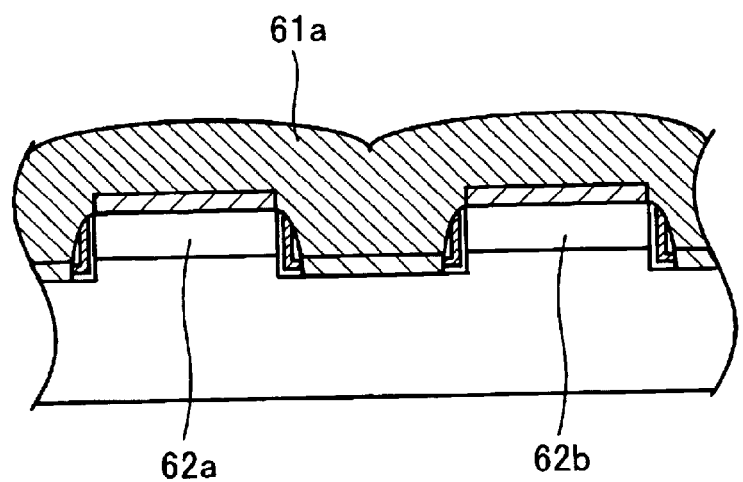
FIG. 20C is a sectional view of the non-volatile semiconductor memory in a polycide layer forming step in the method according to the ninth embodiment.

FIGS. 20A through 20C illustrate a method of manufacturing a non-volatile semiconductor memory in accordance with the ninth embodiment. More specifically, FIG. 20A is a sectional view of the non-volatile semiconductor memory in a gate insulating film removing step. FIG. 20B is a sectional view of the non-volatile semiconductor memory in a step of forming upper surface insulating films and a bottom surface insulating film. FIG. 20C is a sectional view of the non-volatile semiconductor memory in a polycide layer forming step. In FIGS. 20A through 20C, the same components as those shown in FIGS. 15A through 16B are denoted by the same reference numerals as those in FIGS. 15A through 16B.

The gate insulating film 66 shown in FIG. 16A is etched by a known etching technique, so that the entire surface of the p-type silicon semiconductor substrate 65 is exposed, as shown in FIG. 20A. As a result, only the parts by the side walls of the convexities 64*a* and 64*b* have a three-layer structure consisting of the first insulating film 66*a*, the charge capturing film 66*b*, and the second insulating film 66*c*.

A silicon oxide film of approximately 20 nm in thickness is next formed on the exposed p-type silicon semiconductor substrate 65 by a known thermal oxidation technique, as shown in FIG. 20B. As a result, upper surface insulating films 91*a* and 91*b* are formed on the upper surfaces of the convexities 64*a* and 64*b*, and a bottom surface insulating film 92 is formed on the bottom surface of the groove 63. The upper surface insulating films 91*a* and 91*b* and the bottom surface insulating film 92 each serve as a fourth insulating film.

The later steps are the same as those in the method according to the sixth embodiment. More specifically, the polycide layer 61*a* is formed and processed, and the impurity diffusion layers 62*a* and 62*b* are activated, as shown in FIG. 20C. Finally, contact holes (not shown) are opened, and metal wirings are arranged.

In the non-volatile semiconductor memory formed in the above manner, the charge capturing film 66*b* exists only by the side walls of the convexities 64*a* and 64*b*. Thus, accurate position control for the charge capturing regions can be performed.

Also, as the bottom insulating film 92 is formed of a silicon oxide film, the parasitic capacity between the gate electrodes and the source and drain can be reduced. Thus, a non-volatile semiconductor memory that performs high-speed and yet stable operations can be obtained.

Next, the tenth embodiment of the present invention will be described. In the tenth embodiment, the formation of a non-volatile semiconductor memory is carried out in the same manner as the method according to the seventh embodiment, until the step shown in FIG. 17C. The steps to be carried out after the step shown in FIG. 17C will be described below.

FIGS. 21A through 21C illustrate a method of manufacturing a non-volatile semiconductor memory in accordance with the tenth embodiment. More specifically, FIG. 21A is a sectional view of the non-volatile semiconductor memory in a gate insulating film removing step. FIG. 21B is a sectional view of the non-volatile semiconductor memory in a step of forming upper surface insulating films and a bottom surface insulating film. FIG. 21C is a sectional view of the non-volatile semiconductor memory in a polycide layer forming step. In FIGS. 21A through 21C, the same components as those shown in FIGS. 17A through 17C are denoted by the same reference numerals as those in FIGS. 17A through 17C.

After the gate insulating film forming step shown in FIG. 17C, etching is performed on the entire surface by a known etching technique, until the p-type silicon semiconductor substrate 65 is exposed, as shown in FIG. 21A. As a result, only the parts by the side walls of the convexities 64*a* and 64*b* have a three-layer structure consisting of the first insulating film 66*a*, the charge capturing film 66*b*, and the second insulating film 66*c*. Here, approximately 5-nm thick parts of the upper surface insulating films 71*a* and 71*b* formed as the third insulating film remain on the upper surfaces of the convexities 64*a* and 64*b*.

A silicon oxide film of approximately 20 nm in thickness is next formed on the exposed p-type silicon semiconductor substrate 65 by a known thermal oxidation technique, as shown in FIG. 21B. At this point, the upper surface insulating films 71*a* and 71*b* are partially oxidized as well. As a result, upper surface insulating films 101*a* and 101*b* are newly formed as a fourth insulating film on the upper surfaces of the convexities 64*a* and 64*b*. Also, a bottom surface insulating film 102 is formed as the fourth insulating film on the bottom surface of the groove 63.

The later steps are carried out in the same manner as in the seventh embodiment. More specifically, the polycide layer 61*a* is formed and processed, and the impurity diffusion layers 62*a* and 62*b* are activated, as shown in FIG. 21C. Finally, contact holes (not shown) are opened, and metal wirings are arranged.

In the non-volatile semiconductor memory formed in the above manner, the gate insulating film by the side walls of the convexities 64*a* and 64*b*, the upper surface insulating films 101*a* and 101*b*, and the bottom surface insulating film 102, are formed independently of one another. Accordingly, the upper insulating films 101*a* and 101*b* can be formed in a desired thickness, so as to set a desired threshold value.

Also, the bottom surface insulting films 102 made of a silicon oxide film having a smaller capacity than a three-structure can be formed on the upper surfaces of the impurity diffusion layers 62*a* and 62*b*. Thus, the parasitic capacity between the gate electrodes and the source and drain can be reduced, and a non-volatile semiconductor memory that performs high-speed and yet stable operations can be obtained.

Further, as the charge capturing film 66*b* remains only in the vicinities of the side walls of the convexities 64*a* and 64*b*, the position control for the charge capturing regions can be performed more accurately.

Next, the eleventh embodiment of the present invention will be described. In the eleventh embodiment, the same step as the step shown in FIG. 15A is carried out. The steps to be carried out after the step shown in FIG. 15A will be described below.

Figure 22A:
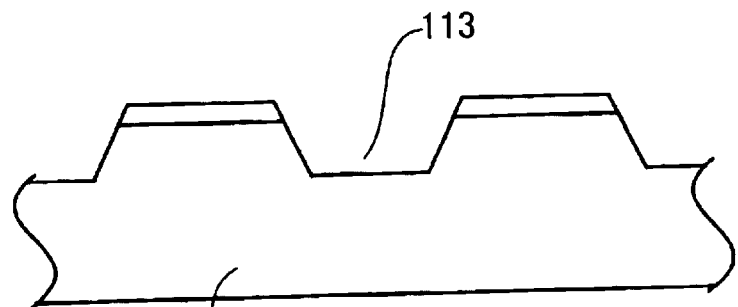
FIG. 22A is a sectional view of a non-volatile semiconductor memory in a groove forming step in a non-volatile semiconductor memory manufacturing method according to an eleventh embodiment of the present invention.
Figure 22B:
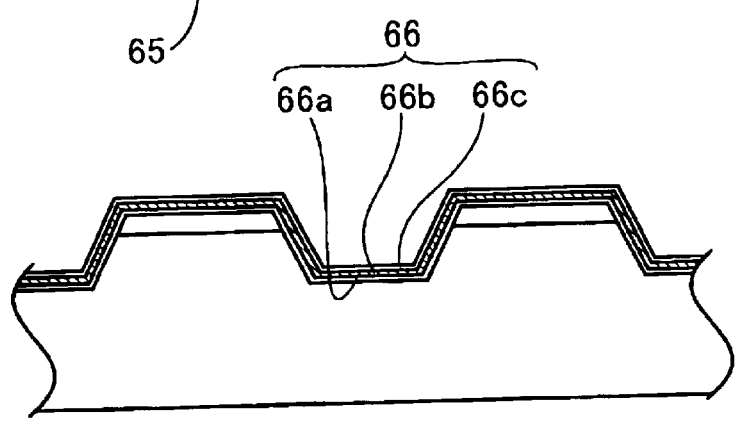
FIG. 22B is a sectional view of the non-volatile semiconductor memory in a gate insulating film forming step in the method according to the eleventh embodiment.
Figure 22C:
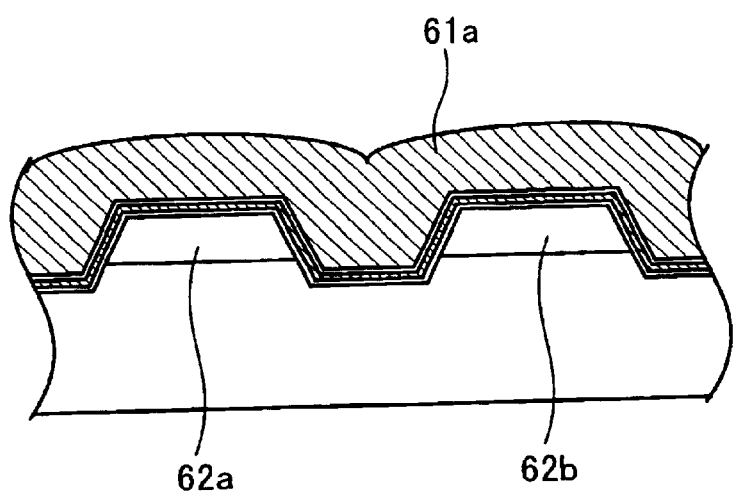
FIG. 22C is a sectional view of the non-volatile semiconductor memory in a polycide layer forming step in the method according to the eleventh embodiment.
Figure 23A:
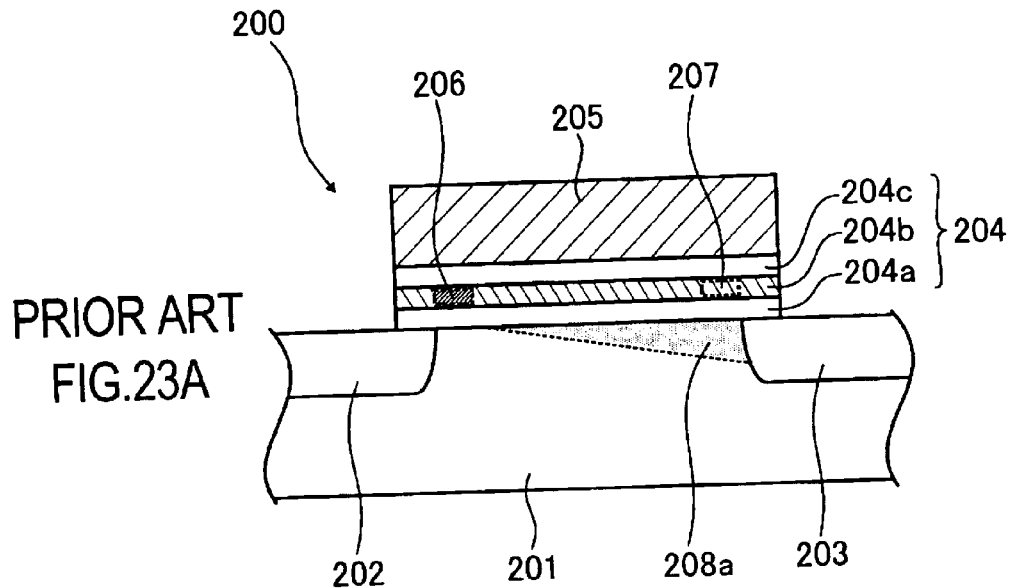
FIG. 23A illustrates an example of a conventional semiconductor memory that is in a write operation.
Figure 23B:
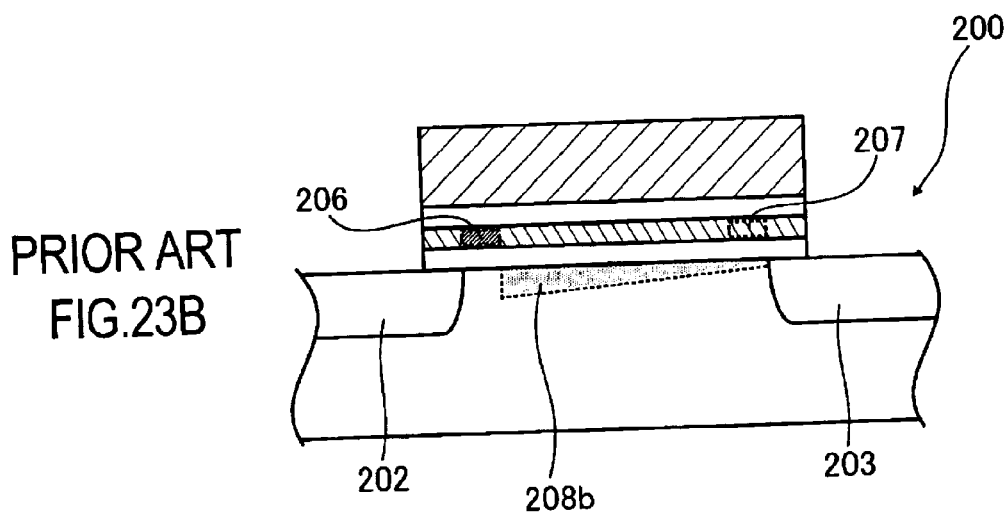
FIG. 23B illustrates the conventional semiconductor memory in a read operation.
Figure 24A:
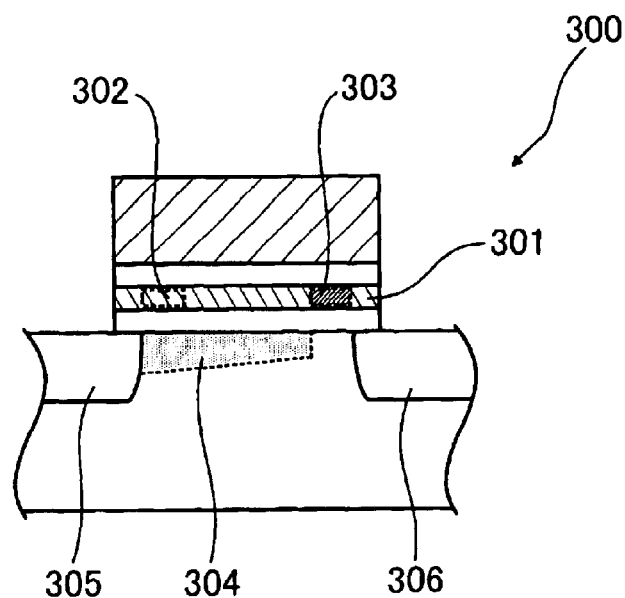
FIG. 24A illustrates an example of a conventional small-sized non-volatile semiconductor memory in which an inversion layer has partially disappeared.
Figure 24B:
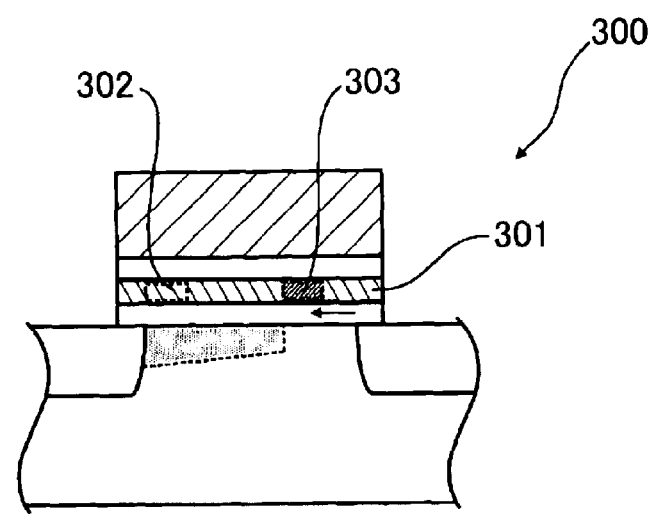
FIG. 24B illustrates an example of the conventional small-sized non-volatile semiconductor memory in which a deviation has been caused at the locations of the bit regions.

FIGS. 22A through 22C illustrate a method of manufacturing a non-volatile semiconductor memory according to the eleventh embodiment. More specifically, FIG. 22A is a sectional view of the non-volatile semiconductor memory in a groove forming step. FIG. 22B is a sectional view of the non-volatile semiconductor memory in a gate insulating film forming step. FIG. 22C is a sectional view of the non-volatile semiconductor memory in a polycide layer forming step. In FIGS. 22A through 22C, the same components as those shown in FIGS. 15A through 15C are denoted by the same reference numerals as those shown in FIGS. 15A through 15C.

After the formation of the impurity diffusion layer 62 shown in FIG. 15A, a groove 113 is formed in the p-type silicon semiconductor substrate 65 by a known photolithography technique and a known etching technique, as shown in FIG. 22A. The groove 113 has a trapezoidal shape in section, with its width narrowing toward the inside.

The formation of this groove 113 is carried out by an anisotropic etching technique, after the photoresist is processed into a trapezoidal shape by a photolithography technique.

The later steps are carried out in the same manner as in the sixth embodiment. More specifically, the gate insulating film 66 having a three-layer structure consisting of the first insulating film 66a, the charge capturing film 66b, and the second insulating film 66c, is formed as shown in FIG. 22B. The polycide layer 61a is then created by forming a polycrystalline silicon film and a tungsten silicide film on the entire surface by a CVD technique, as shown in FIG. 22C. After the polycide layer 61a is processed, an activating thermal treatment is performed so as to form the impurity diffusion layers 62a and 62b. Finally, contact holes (not shown) are opened, and metal wirings are arranged.

In the non-volatile semiconductor memory formed in the above manner, the tilt of the side walls of the groove 113 can be arbitrarily set. Accordingly, the processing margin of the gate electrodes formed from the polycide layer 61a is widened. Thus, a non-volatile semiconductor memory with a high yield and high reliability can be obtained.

In a case where the side walls of a groove stand vertically, an etching residue might remain on the side walls of the groove after the etching of the polycide layer. Such a problem can be solved by this embodiment in which the side walls of the groove 113 are tilted.

As described above with respect to the seventh to eleventh embodiments, the channel region of a non-volatile semiconductor memory is formed into a concave shape, and the charge capturing regions are formed within the gate insulating film 66 in the vicinities of the side walls of the convexities 64a and 64b. In this manner, an effective channel length is secured. Thus, a non-volatile semiconductor memory that can be easily reduced in size while maintaining a high reliability can be obtained.

Furthermore, the impurity diffusion layers 62a and 62b are formed on the two convexities 64a and 64b that form the concavity. Accordingly, the implanted impurities can be prevented from spreading horizontally at the time of the activating thermal treatment. Thus, the impurity diffusion layers 62a and 62b can be shaped with a high precision, and the reliability of the non-volatile semiconductor memory can be increased.

Although a silicon nitride film is formed as the charge capturing films 16a and 66b in the above embodiments, it is possible to form them with another material that is capable of capturing electrons. Also, other than the three-layer structure, the gate insulating films 16 and 66 may have any other structure such as a two-layer structure consisting of a silicon oxide film and a silicon nitride film, or a one-layer structure only including a silicon nitride film, as long as the structure includes at least one film that is capable of capturing electrons.

As described so far, the present invention provides a structure in which a gate insulating film is formed on a semiconductor substrate having at least one convexity. Charge capturing regions are then formed within the gate insulating film in the vicinities of the side walls of the convexity. Accordingly, an effective channel length is secured despite the non-volatile semiconductor memory is reduced in size. Thus, according to the present invention, non-volatile semiconductor memories that can be easily reduced in size and yet maintain a high reliability can be obtained.

The foregoing is considered as illustrative only of the principles of the present invention. Further, since numerous modifications and changes will readily occur to those skilled in the art, it is not desired to limit the invention to the exact construction and applications shown and described, and accordingly, all suitable modifications and equivalents may be regarded as falling within the scope of the invention in the appended claims and their equivalents.

What is claimed is:

1. A non-volatile semiconductor memory comprising:
   a semiconductor substrate having convexities;
   a gate electrode;
   a gate insulating film in which a charge capturing region is formed in the vicinities of the side walls of the convexities, the gate insulating film being formed between the semiconductor substrate and the gate electrode;
   a pair of impurity diffusion layers at the bottoms of adjacent grooves that form the convexities of the semiconductor substrate, the pair of impurity diffusion layers serving as a source and a drain of a single memory cell transistor; and
   a convex channel region formed in the side walls and upper surface of the convexities.

2. A non-volatile semiconductor memory comprising:
   a semiconductor substrate having convexities;
   a gate electrode;
   a gate insulating film in which a charge capturing region is formed in the vicinities of the side walls of the convexities, the gate insulating film being formed between the semiconductor substrate and the gate electrode;
   a pair of an impurity diffusion layers formed in adjacent ones of the convexities of the semiconductor substrate, the impurity diffusion layers serving as a source and a drain of a single memory cell transistor; and
   a concave channel region formed in the side walls of the convexities and the bottom of a groove which forms the convexities.

3. The non-volatile semiconductor memory according to either claim 1 or claim 2, wherein the gate insulating film includes a silicon nitride film.

4. The non-volatile semiconductor memory according to either claim 1 or claim 2, wherein the film thickness of the gate insulating film on the upper surface of the convexities and/or the film thickness of the gate insulating film on the bottom surfaces of the grooves forming the convexities are greater than the film thickness of the gate insulating film in the vicinities of the side walls of the convexities.

5. The non-volatile semiconductor memory according to either claim 1 or claim 2, wherein a charge capturing rate of the gate insulating film in the vicinities of the side walls of the convexity is higher than a charge capturing rate of the gate insulating film on the upper surface of the convexity and/or a charge capturing rate of the gate insulating film on the bottom surfaces of the grooves that form the convexity.

* * * * *